United States Patent
Takagi et al.

(10) Patent No.: US 10,720,307 B2
(45) Date of Patent: Jul. 21, 2020

(54) ELECTRON MICROSCOPE DEVICE AND INCLINED HOLE MEASUREMENT METHOD USING SAME

(71) Applicant: HITACHI HIGH-TECHNOLOGIES CORPORATION, Tokyo (JP)

(72) Inventors: Yuji Takagi, Tokyo (JP); Fumihiko Fukunaga, Tokyo (JP); Yasunori Goto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/332,212

(22) PCT Filed: Sep. 14, 2017

(86) PCT No.: PCT/JP2017/033260
§ 371 (c)(1),
(2) Date: Mar. 11, 2019

(87) PCT Pub. No.: WO2018/052083
PCT Pub. Date: Mar. 22, 2018

(65) Prior Publication Data
US 2019/0362933 A1 Nov. 28, 2019

(30) Foreign Application Priority Data
Sep. 14, 2016 (JP) .................. 2016-179757

(51) Int. Cl.
*H01J 37/28* (2006.01)
*G01N 21/47* (2006.01)
(Continued)

(52) U.S. Cl.
CPC .............. *H01J 37/28* (2013.01); *G01N 21/47* (2013.01); *G01N 21/9501* (2013.01);
(Continued)

(58) Field of Classification Search
CPC .......... H01J 37/28; H01J 37/22; H01J 37/261; H01J 2237/24592; H01J 37/147;
(Continued)

(56) References Cited

U.S. PATENT DOCUMENTS

2005/0016682 A1 1/2005 Nagatomo et al.
2005/0277029 A1 12/2005 Sasajima et al.
(Continued)

FOREIGN PATENT DOCUMENTS

JP 2001-110862 A 4/2001
JP 2005-038976 A 2/2005
(Continued)

*Primary Examiner* — Michael Maskell
(74) *Attorney, Agent, or Firm* — Volpe and Koenig, P.C.

(57) ABSTRACT

An electron microscope device includes: a first detection means disposed at a high elevation angle for detecting electrons having relatively low energy; a second detection means disposed at a low elevation angle for detecting electrons having relatively high energy; a means for identifying, from a first image obtained from a first detector, a hole region in a semiconductor pattern within a preset region; a means for calculating for individual holes, from a second image obtained from a second detector, indexes pertaining to an inclined orientation and an inclination angle, on the basis of the distance between the outer periphery of the hole region and the hole bottom; and a means for calculating, from the results measured for the individual holes, indexes pertaining to an inclined orientation of the hole and an inclination angle of the hole as representative values for the image being measured.

18 Claims, 17 Drawing Sheets

(51) Int. Cl.
*G01N 21/95* (2006.01)
*G01N 23/2251* (2018.01)
*H01J 37/22* (2006.01)
*H01J 37/26* (2006.01)

(52) U.S. Cl.
CPC .......... *G01N 23/2251* (2013.01); *H01J 37/22* (2013.01); *H01J 37/261* (2013.01); *G01N 2021/4709* (2013.01); *H01J 2237/24592* (2013.01)

(58) Field of Classification Search
CPC ... H01J 37/244; G01N 21/47; G01N 21/9501; G01N 23/2251; G01N 2021/4709; G01N 2223/6116; G01B 15/00; G01B 15/04; H01L 22/12

USPC .................................. 250/306, 307, 310, 311
See application file for complete search history.

(56) References Cited

U.S. PATENT DOCUMENTS

| | | |
|---|---|---|
| 2014/0375793 A1 | 12/2014 | Harada et al. |
| 2016/0379798 A1 | 12/2016 | Shishido et al. |
| 2016/0379902 A1* | 12/2016 | Hagio .................... H01L 22/12 438/5 |

FOREIGN PATENT DOCUMENTS

| | | |
|---|---|---|
| JP | 2013-168595 A | 8/2013 |
| JP | 2015-106530 A | 6/2015 |
| JP | 2017-016791 A | 1/2017 |

\* cited by examiner (a) NORMAL HOLE
(b) INCLINED HOLE
(c) INCLINED HOLE (a) NORMAL HOLE
(b) INCLINED HOLE

403
SIDEWALL EDGE (a)　　　　　　　(b)

ELECTRON MICROSCOPE DEVICE AND INCLINED HOLE MEASUREMENT METHOD USING SAME

TECHNICAL FIELD

The present invention relates to an electron microscope device for measuring a pattern formed on a semiconductor wafer, and an inclined hole measurement method using the same. In particular, the invention relates to an electron microscope device for measuring inclination of a hole pattern formed on a semiconductor wafer, and an inclined hole measurement method using the same.

BACKGROUND ART

A dry etching device, which is a processing device for a semiconductor wafer, forces ionized gas molecules to act on a wafer surface through an electric field between parallel plate condensers in a gas chamber. However, a wafer fixing jig is damaged with time in such processing, which disturbs the electric field on an outer periphery of the wafer and disables perpendicular processing to the wafer. In a hole having a high aspect ratio which is processed on a DRAM (Dynamic Random Access Memory) or a 3D-NAND (3-Dimension NAND type flush memory), the hole is inclined, which causes a decrease in yield.

PTL 1 discloses a method, for the purpose of inspecting a hole pattern formed on a substrate, of obtaining an image of the hole pattern, obtaining an upper surface shape and a lower surface shape of the hole pattern from the image, and detecting a positional displacement between the upper surface and the lower surface of the hole pattern. FIG. 2 of PTL 1 shows that such displacement is caused by inclination of the hole.

PTL 2 discloses an electron beam microscope system for measuring a hole pattern on a substrate, which is capable of obtaining respective images of backscattered electrons and secondary electrons, detecting a top contour of a hole from the secondary electron image and a bottom contour of the hole from the backscattered electron image, and determining that the hole is not provided perpendicularly by evaluating displacement of centers of each of the contours.

PTL 3 discloses an electron beam microscope system for measuring an overlay of a hole pattern on a substrate, and discloses a method of dividing and recognizing circuit pattern regions formed in each process, quantifying a difference between a reference image and a measured image through image processing with respect to each of the patterns, and calculating an overlay from a result of quantification of the difference.

PTL 4 discloses an electron beam microscope system for measuring a hole pattern on a substrate, and discloses a method of providing a means for irradiating a sample with a primary electron beam accelerated by a high acceleration voltage and a means for detecting backward scattered electrons of low angles, and measuring a depth of a hole and a diameter of a hole bottom by detecting electrons emitted from the hole bottom passing through the sample.

PRIOR ART LITERATURE

Patent Literature

PTL 1: JP-A-2001-110862
PTL 2: JP-A-2015-106530
PTL 3: JP-A-2013-168595
PTL 4: JP-A-2015-106530

SUMMARY OF INVENTION

Technical Problem

Even if a processed hole is normal, a diameter thereof decreases toward a bottom thereof. If processed perpendicularly, a contour of the hole bottom falls inside a contour of a hole top, and the contour of the hole bottom is not blocked by a sample surface when observed in an image imaged directly above a wafer (a top view image). However, in a hole having a high aspect ratio observed in a DRAM or a 3D-NAND, when inclination occurs in the hole, the contour of the hole bottom is blocked in accordance with a degree of inclination of the sample surface in the top view image. For this reason, the techniques disclosed in PTL 1 and PTL 2 have the following problems with respect to inclined hole measurement in a high-aspect hole in a DRAM or a 3D-NAND.

That is, although PTL 1 and PTL 2 disclose that inclination of the hole can be measured through displacement between the centers of the top contour and the bottom contour of the hole, in a case in which the contour of the hole bottom is blocked by the sample surface, the center of the hole bottom cannot be detected correctly, the inclination of the hole represented by the displacement of the centers of the top contour and the bottom contour is smaller than an actual value, and thus a correct inclination state cannot be measured.

The invention provides an electron microscope device capable of measuring a degree of inclination of a high-aspect hole of a DRAM or a 3D-NAND in a top view image of hole inclination of the hole even when a bottom portion of the hole is blocked by a surface layer due to hole inclination, and provides and an inclined hole measurement method using the same.

Solution to Problem

In order to solve the above problems, the invention provides an electron microscope device for measuring inclination of a hole formed on a semiconductor wafer, the electron microscope device comprising: a first detection unit disposed at a high elevation angle and configured to detect electrons having relatively low energy among electrons generated from the semiconductor wafer on which the hole is formed due to a primary electron beam irradiated on the semiconductor wafer; a second detection unit disposed at a low elevation angle and configured to detect electrons having relatively high energy among the electrons generated from the semiconductor wafer due to the primary electron beam irradiated on the semiconductor wafer; a hole region specification unit configured to process a first image obtained from an output signal from the first detection unit in which the electrons having relatively low energy are detected, so as to specify a hole region of a semiconductor pattern in a preset region; an inclination information calculation unit configured to process a second image obtained from an output signal from the second detection unit in which electrons having relatively high energy are detected, so as to calculate for the individual hole regions, indexes pertaining to an inclined orientation of the hole region and an inclination angle of the hole region with respect to the plurality of hole regions included in the second image, on the basis of a distance between an outer periphery of the hole region specified by the hole region specification unit and a hole bottom of the hole region detected in a center direction of the hole region from the outer periphery; and an index value calculation unit configured to calculate, from a result calculated for the individual hole regions by the inclination information calculation unit, index values pertaining to the inclined orientation of the hole region and the inclination angle of the hole region as representative values of the plurality of hole regions in the second image.

Advantageous Effect

According to the invention, it is possible to measure a degree of inclination of a hole having a high aspect ratio from a top view image of the hole even when a bottom portion of the hole is blocked by a surface layer due to hole inclination.

DESCRIPTION OF EMBODIMENTS

The invention relates to an electron beam microscope device, which is configured to irradiate a converged electron beam on a sample having a hole having a high aspect ratio, to simultaneously detect secondary electrons having relatively low energy generated from the sample and backscattered electrons having relatively high energy with separate detectors, so as to generate a secondary electron image and a backscattered electron image, and to measure inclination of the hole by comparing information obtained from the secondary electron image and the backscattered electron image, by utilizing a characteristic that a bottom of a hole can be revealed in the backscattered electron image.

Embodiments of the invention will be described below with reference to the drawings.

First Embodiment

Figure 1:
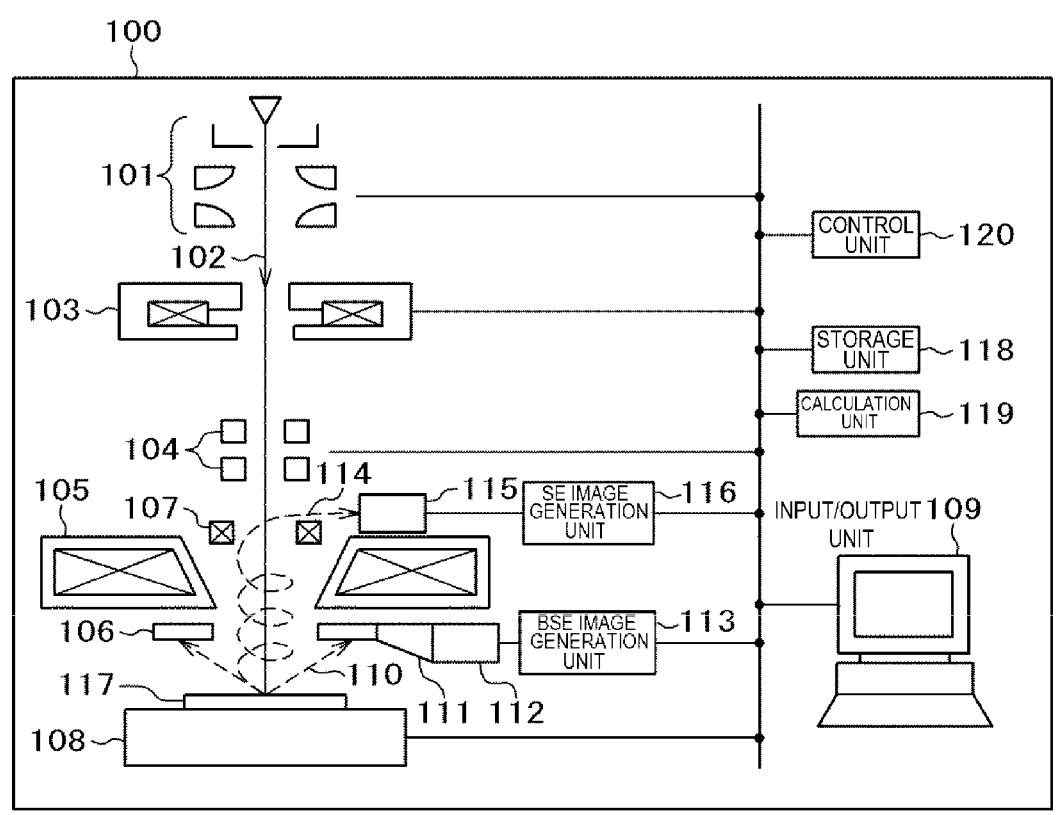
FIG. 1 is a block diagram showing a configuration of an electron beam microscope according to a first embodiment of the invention.

FIG. 1 is a diagram showing a basic configuration of a scanning electron microscope device (hereinafter referred to as an electron microscope device) 100 to which the invention is applied. The electron microscope device 100 includes an electron gun 101 for emitting a primary electron beam 102, a condenser lens 103 for converging the primary electron beam 102, a polarizing lens 104 for deflecting the primary electron beam 102, an object lens 105 for converging the primary electron beam 102, a stage 108 movable in a plane while mounted with a sample 117, an annular scintillator 106 for detecting backscattered electrons 110 generated from the sample 117 irradiated with the primary electron beam 102, an optical fiber 111 for transmitting an optical signal output from the annular scintillator 106, a photomultiplier tube 112 for inputting the optical signal transmitted from the optical fiber 111, a BSE image generation unit 113 for processing a signal output from the photomultiplier tube 112 to generate an image, an ExB deflector 107 for changing an orbit of secondary electrons 114 generated from the sample 117 irradiated with the primary electron beam 102, a photomultiplier tube 115 for detecting the secondary electrons whose orbit is changed by the ExB deflector 107, an SE image generation unit 116 for processing the signal output from the photomultiplier tube 115 to generate an image, a storage unit 118 for storing data, a calculation unit 119, an input/output unit 109, and a control unit 120 for controlling the entire electron microscope device.

Although 110 is backscattered electrons and 114 is secondary electrons, the essence of the function provided by the present disclosure is not impaired even if 110 is electrons having relatively high energy and 114 is electrons having relatively low energy.

The electron gun 101, the condenser lens 103, the polarizing lens 104, the object lens 105, the stage 108, the annular scintillator 106, the optical fiber 111, the photomultiplier tube 112, and the photomultiplier tube 115 are disposed in a column whose inside can be evacuated, which is not shown.

In such configuration, the primary electron beam 102 having a high acceleration voltage (for example, 15 kilovolts or more) generated by the electron gun 101 is converged by the condenser lens 103, and is further converged on a surface of the sample 117 by the object lens 105; and the sample is scanned two-dimensionally by the deflection lens 104. The sample as a target of the invention is a hole pattern having a high aspect ratio of about several microns in depth with respect to a hole diameter of about several tens of nm.

The backscattered electrons (BSE) 110 emitted from the sample 117 irradiated with the primary electron beam 102 are detected by the annular scintillator 106, converted to an optical signal, and guided to the photomultiplier tube 112 by the optical fiber 111. A digital image is formed by the BSE image generation unit 113 from a signal output from the photomultiplier tube 112. Examples of the annular scintillator 106 for detecting backscattered electrons include an annular YAG scintillator, an annular semiconductor detector, or a Robinson detector. Further, instead of using an annular detector, detectors may be arranged in a plurality of orientations.

The secondary electrons (SE) 114 emitted from the sample 117 irradiated with the primary electron beam 102 are guided to the photomultiplier tube 115 with their orbit changed by the ExB deflector 107, and a digital image is formed by the SE image generation unit 116 from a signal output from the photomultiplier tube 115. A feature of this configuration is that the BSE image and the SE image at the same location on the sample 117 are imaged simultaneously. By moving the stage 108, an image is imaged at an arbitrary position of the sample 117. The imaged image is stored in the storage unit 118.

The control unit 120 controls a voltage applied to a periphery of the electron gun 101, focus adjustment of the condenser lens 103 and the objective lens 105, scan of the primary electron beam 02 on the surface of the sample 117 performed by the deflection lens 104, movement of the stage 108, operation timing of the BSE image generation unit 113 and the SE image generation unit 116, and the external data transmission and reception via an input/output I/F (not shown). The calculation unit 119 performs processing of images generated by the BSE image generation unit 113 and the SE image generation unit 116 and numerical calculation. Input of sample information, input of imaging conditions, output of inspection result, and the like are performed by the input/output unit 109.

Figure 2:
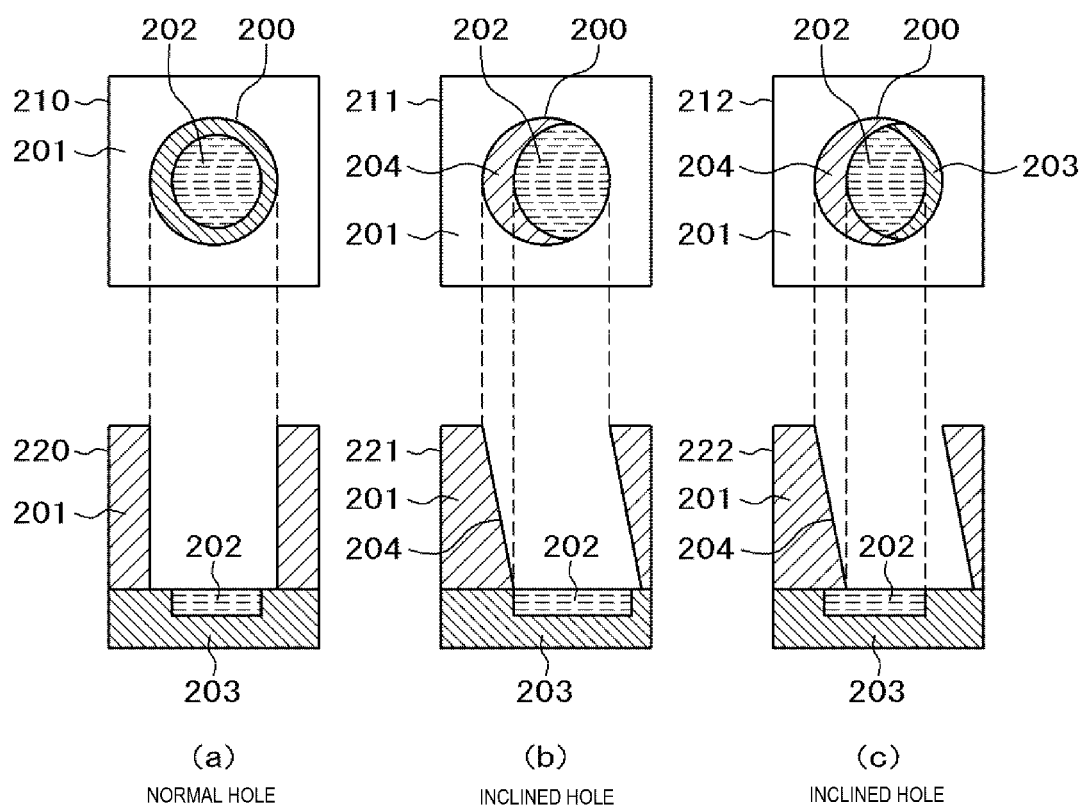
FIG. 2 is a top view image (upper side) and a hole cross-sectional view (lower side) showing normal and inclined states of a hole having a plug at a hole bottom of a sample being measured according to the first embodiment of the invention.

A relationship between an imaged image example of a hole pattern (hereinafter referred to as "hole") being measured in FIG. 2 and FIG. 3 and a cross section of the device will be described. FIG. 2 shows an example in which an upper layer 201 is stacked on a lower layer 203, and a plug 202 is formed on a lower layer on a bottom of the hole. FIG. 2(a) is an example of a normal hole, and FIGS. 2(b) and 2(c) are examples of inclined holes. An upper column of FIG. 2 is examples of top view images 210, 211, 212 imaged from directly above the objects, and a lower column is hole cross sections 220, 221, 222 of the device.

In the case of a normal case in FIG. 2(a), the plug 202 is included inside a hole region 200 in the top view image 210, and the lower layer 203 is observed around the plug 202. A hole opening on an upper layer surface is referred to as a hole top, and a hole region on the lower layer 203 is referred to as a hole bottom. In the top view image 210, the lower layer 203 is darker than the upper layer 201. In the hole cross section in FIG. 2(a), the opening is drawn perpendicularly, while a diameter thereof actually decreases toward a lower portion of the hole. Therefore, in the top view image 210, a portion from the upper layer 201 to the lower layer 203 changes continuously instead of changing stepwise from a brightness of the upper layer 201 to a brightness of the lower layer 203. Moreover, brightness, which reflects a contrast of a hatching applied to the plug 202, the upper layer 201, and the lower layer 203, does not always correspond to the actual brightness. In particular, the plug 202 is made of a metal material and thus is bright, and may have the same brightness as that of the upper layer 201 depending on the irradiation conditions of the electron beam.

FIG. 2(b) shows an example of an inclined hole. A sidewall 204 is observed in the hole region 200 in the top view image 211. FIG. 2(b) shows a case where the plug 202 is aligned with the bottom of the hole, and a right side of the plug 202 is blocked by the upper layer 201 in the top view image 211.

FIG. 2(c) is an example of an inclined hole, in which overlap of the top contour of the hole and the plug 202 is different from that in FIG. 2(b). In the top view image 212, a left side of the plug 202 is blocked by the sidewall 204, and the lower layer 203 is observed on the right side of the plug 202.

Figure 3:
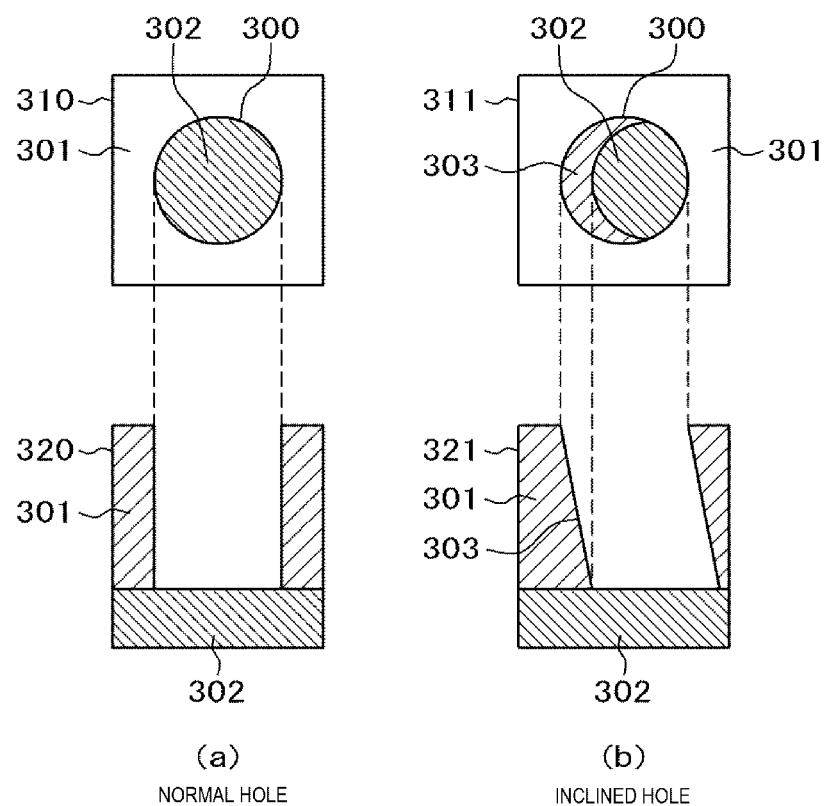
FIG. 3 is a top view image (upper side) and a hole cross-sectional view (lower side) showing normal and inclined states of a hole without a plug at the hole bottom of a sample being measured according to the first embodiment of the invention.

FIG. 3 is an example of a process in which a plug is not formed on the bottom of the hole, and an upper layer 301 is stacked on a lower layer 302. FIG. 3(a) is an example of a normal hole, and FIG. 3(b) is an example of an inclined hole.

In the case of the normal example in FIG. 3(a), the lower layer 302 is darker than the upper layer 301 in a top view image 310. In a hole cross section 320 in FIG. 3(a), the opening is drawn perpendicularly, while a diameter thereof actually decreases toward a lower portion of the hole. Therefore, in the top view image 310, the portion from the upper layer 301 to the lower layer 302 changes continuously instead of changing stepwise from the brightness of the upper layer 301 to the brightness of the lower layer 302.

FIG. 3(b) shows an example of an inclined hole as shown in a hole cross section 321. A sidewall 303 is observed in a hole region 300 in a top view image 311.

Figure 4:
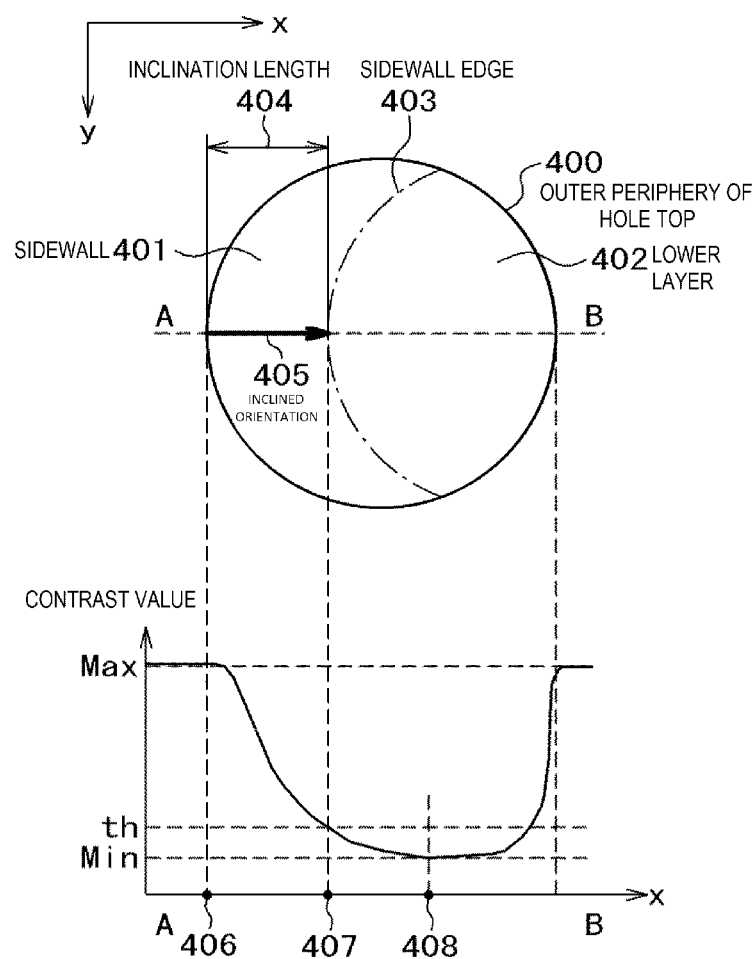
FIG. 4 is a schematic view of a top view image of an inclined hole as a sample being measured according to the first embodiment of the invention (upper side) and a graph schematically showing a change in a contrast value on a line A-B in the schematic view (lower side).

First, description will be performed with reference to FIGS. 4 to 9, with the case where no plug is on a hole bottom in FIG. 3 as an example. An upper section of FIG. 4 is a schematic view of a top view image of an inclined hole, and a lower section of FIG. 4 is a graph schematically showing a change in a contrast value on a line A-B in the schematic view of the upper section. A coordinate system x, y in the image schematic view in the upper section of FIG. 4 represents an image coordinate system.

A hole top outer periphery 400 is the contour of the hole on an upper layer portion. A sidewall 401 and a lower layer 402 are inside the hole. A boundary between the sidewall 401 and the lower layer (or the hole bottom) 402 is referred to as a sidewall edge (or a sidewall end) 403.

An inclination length 404 is a maximum distance value on in top view image from the hole top outer periphery 400 to the sidewall edge 403, and an orientation providing the maximum distance value is defined as an inclined orientation 405. A direction from the hole top outer periphery 400 toward the sidewall edge 403 is defined as an inclined orientation, but may also be defined as a direction from the sidewall edge 403 to the hole top outer periphery 400. In addition, an expression "from the hole top outer periphery 400 to the hole bottom" has the same meaning as "from the hole top outer periphery 400 to the sidewall edge 403".

An inclination length L: 404 is a length of the sidewall 401 as viewed from the top. Since an inclination angle θ of the hole can be obtained with θ=atan(L/D) . . . (Formula 1) as long as a depth D of the hole is known from process data of a film thickness of the upper layer, etc., the inclination length L: 404 can be used as an index of the inclination angle.

A contrast value on a line A-B reaches a maximum value Max at a hole outer peripheral position 406, decreases toward a sidewall edge position 407, and reaches a minimum value Min at a position 408 in the lower layer 402. Using a preset parameter α (0≤α≤1) determined on the basis of the maximum value Max and the minimum value Min, the sidewall edge position 407 or the vicinity thereof may be determined with a threshold value th with th=α×(Max−Min)+Min . . . (Formula 2). Alternatively, since a contrast change in the vicinity of the sidewall edge position 407 is large, the sidewall edge position 407 or the vicinity thereof may be determined by calculating a differential value of the contrast change and determining a local differential maximum value position that appears first in a direction from A to B except for the vicinity of the hole outer peripheral position 406.

Figure 5:
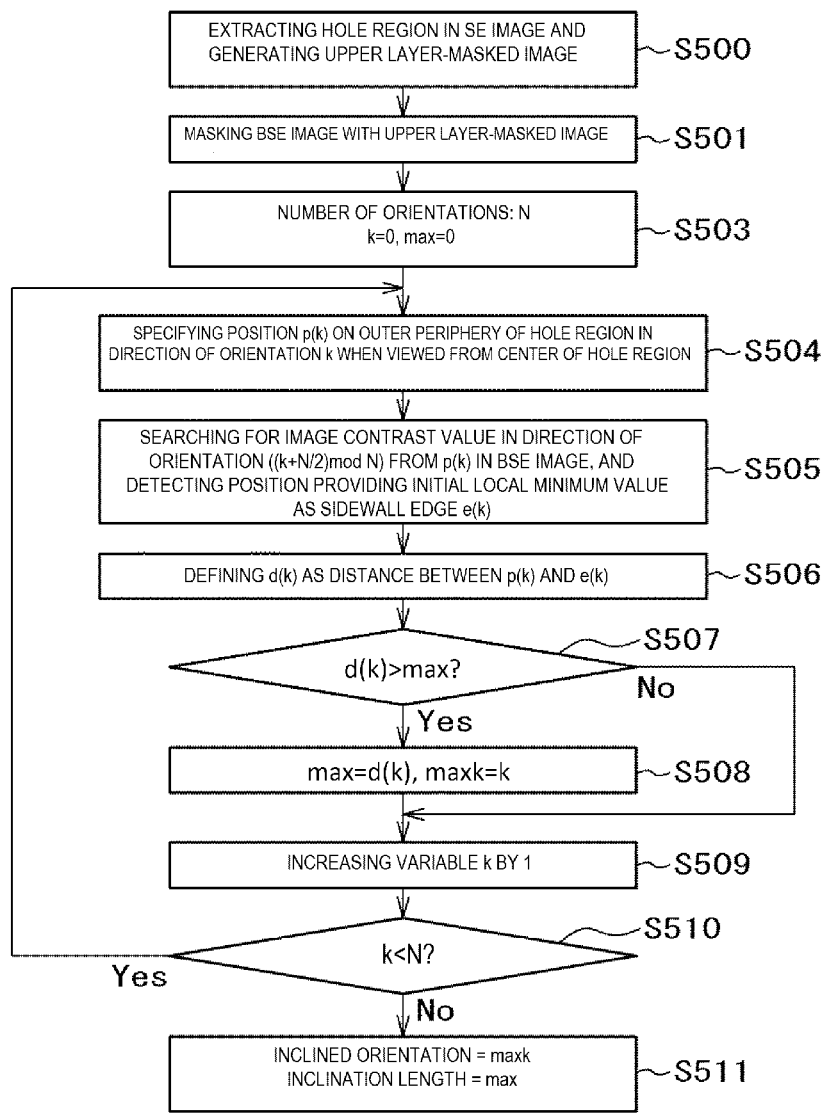
FIG. 5 is a processing flow chart of inclination measurement for obtaining an inclined orientation and an inclination length of a hole according to the first embodiment of the invention.
Figure 6:
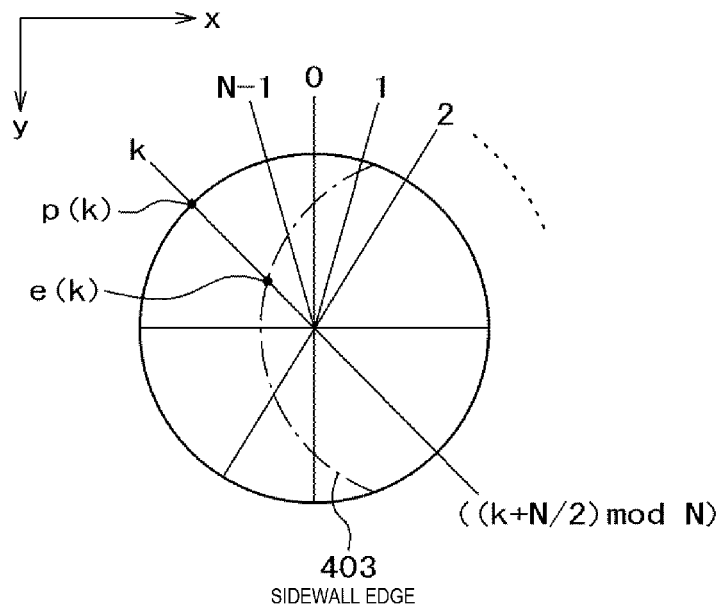
FIG. 6 is a schematic view of a BSE image illustrating an orientation and a position in inclination measurement of a hole according to the first embodiment of the invention.

A way to determine the inclination length and the inclined orientation will be described with reference to FIGS. 5 and 6. FIG. 6 is an explanatory view of orientations and positions appearing in the flow chart of FIG. 5.

First, a hole region is detected in an SE image obtained by the SE generation unit 115 (S500). In the SE image, since a contrast between the upper layer 301 and the lower layer 302 is high, an upper layer region and the hole region of the SE image are divided with a predetermined threshold value or a threshold value dynamically determined by Otsu binarization, etc. After division, an upper layer-masked image in which the upper layer region is set to 0 and the hole region is set to 1 is generated, so as to specify the hole region.

Next, a BSE image obtained by the BSE image generation unit 113 is masked with the above-described upper layer-masked image, so as to create an image having non-zero pixel values only in the hole region of the BSE image (S501). In S503, variables k and max used in the processing are initialized to 0, and a number of orientations N is set. N is an even number. As shown in FIG. 6, N is for determining N orientations at equal angular intervals with a direction of (x,y)=(0,−1) in the image as an orientation 0.

A position p (k) on the outer periphery of the hole region in a direction of an orientation k from a hole region center is determined (S504), an image contrast value is searched in a direction in an orientation ((k+N/2) mod N) from the position p(k) in the BSE image obtained by the BSE image generation unit 113, and a position e(k) of the sidewall edge is detected by the method illustrated in FIG. 4 (S505). Here, A mod B represents remainder calculation, and is a remainder of dividing A by B.

A distance d(k) between the obtained e(k) and p(k) is calculated (S506) and compared with the variable max (S507). If d(k) is larger, max is updated to the value d(k), and maxk is updated to the value k (S508). The variable k is increased by 1 (S509), and if k is smaller than N, the process returns to S504, and if N or more, the process proceeds to S511 (S510). The finally obtained maxk is calculated as the inclined orientation and max as the inclination length.

In the above processing, the SE image generated by the SE image generation unit 116 and the BSE image generated by the BSE image generation unit 113 are stored in the storage unit 118, read by the calculation unit 119, and subjected to image processing. Numerical values obtained as a result of the image processing are also stored in the storage unit 118, and read and processed by the calculation unit 119. The calculation unit 119 includes a hole region specification unit, and a calculation unit for calculating the inclined orientation (maxk) and the inclination length (max).

Figure 7:
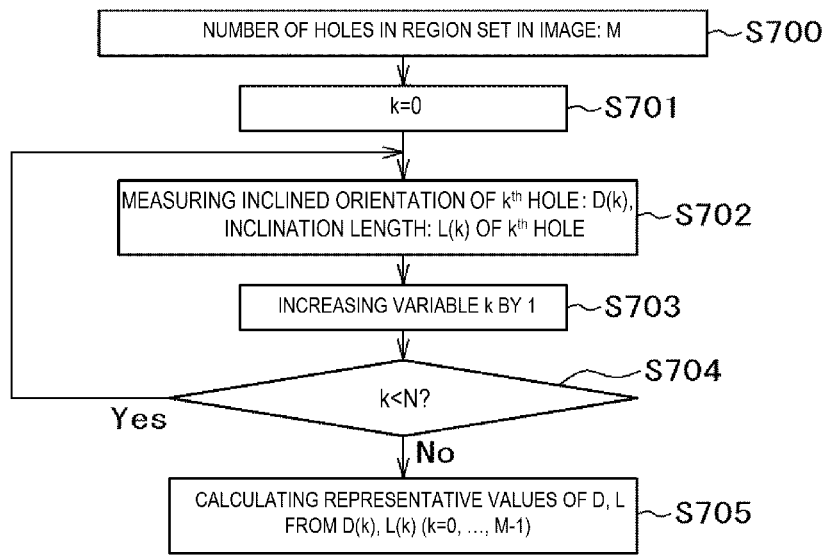
FIG. 7 is a processing flow chart illustrating how to obtain representative values when a plurality of holes exist in the image being measured according to the first embodiment of the invention.

FIG. 7 is a processing flow chart illustrating how to obtain representative values when a plurality of holes exist in the image being measured. A number of holes being processed in the image being measured is defined as M (S700). The counter k is initialized to 0 (S701), and an inclined orientation D (k) and the inclination length L(k) of the $k^{th}$ hole are measured (S702). If k is smaller than M, the process returns to S702, and if M is greater than M, representative values D and L of the measurement target image are calculated from D(k), L(k) (k=0, . . . , m−1) (S705).

The representative values may be: (1) average values of the orientation and the inclination length; (2) a median of the orientation, and an average value of the inclination length L(k) at an orientation whose difference to the median of the orientation is in a certain range; (3) a most frequent value of the orientation, and an average value of the inclination length L (k) at an orientation whose difference to the most frequent value of the orientation is in a certain range; (4) a median of the inclination length, and an average value of the orientation (k) at an inclination length whose difference to the median of the inclination length is in a certain range; and (5) a most frequent value of the inclination length, and an average value of the orientation (k) at an inclination length whose difference to the most frequent value of the inclination length is in a certain range. A value determined as the certain range may be preset.

The calculation unit 119 includes means for calculating the inclined orientation D and the inclination length L (indexes pertaining to the inclination angle) of the hole as representative values of the image being measured.

Figure 8:
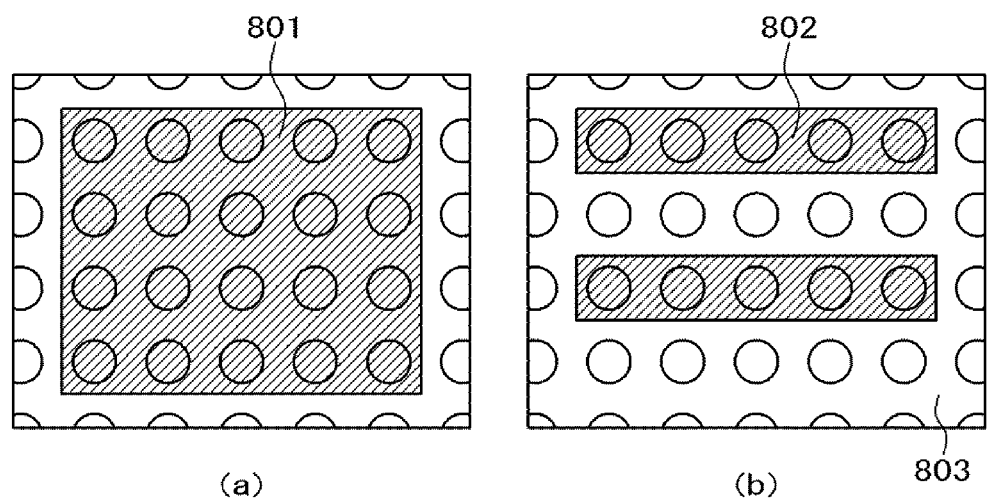
FIG. 8 is a schematic view of an image including a hole showing a setting example of a processing region with respect to an image being measured according to the first embodiment of the invention.

In the case of selectively measuring the holes in the image, a processing region as shown with oblique lines in FIG. 8 is preset. FIG. 8(a) illustrates a case where all of the holes in the image are measured, while the processing region 801 is limited so that the holes at edges of the image are not measured. FIG. 8(b) shows a case where the holes in the image are selectively measured. Although a selection method may be considered other than selecting for each column, in a case where a selection area 802 and a non-selection area 803 are formed by different processes, since formation states of the holes may be different, it is effective to measure them separately.

Figure 9:
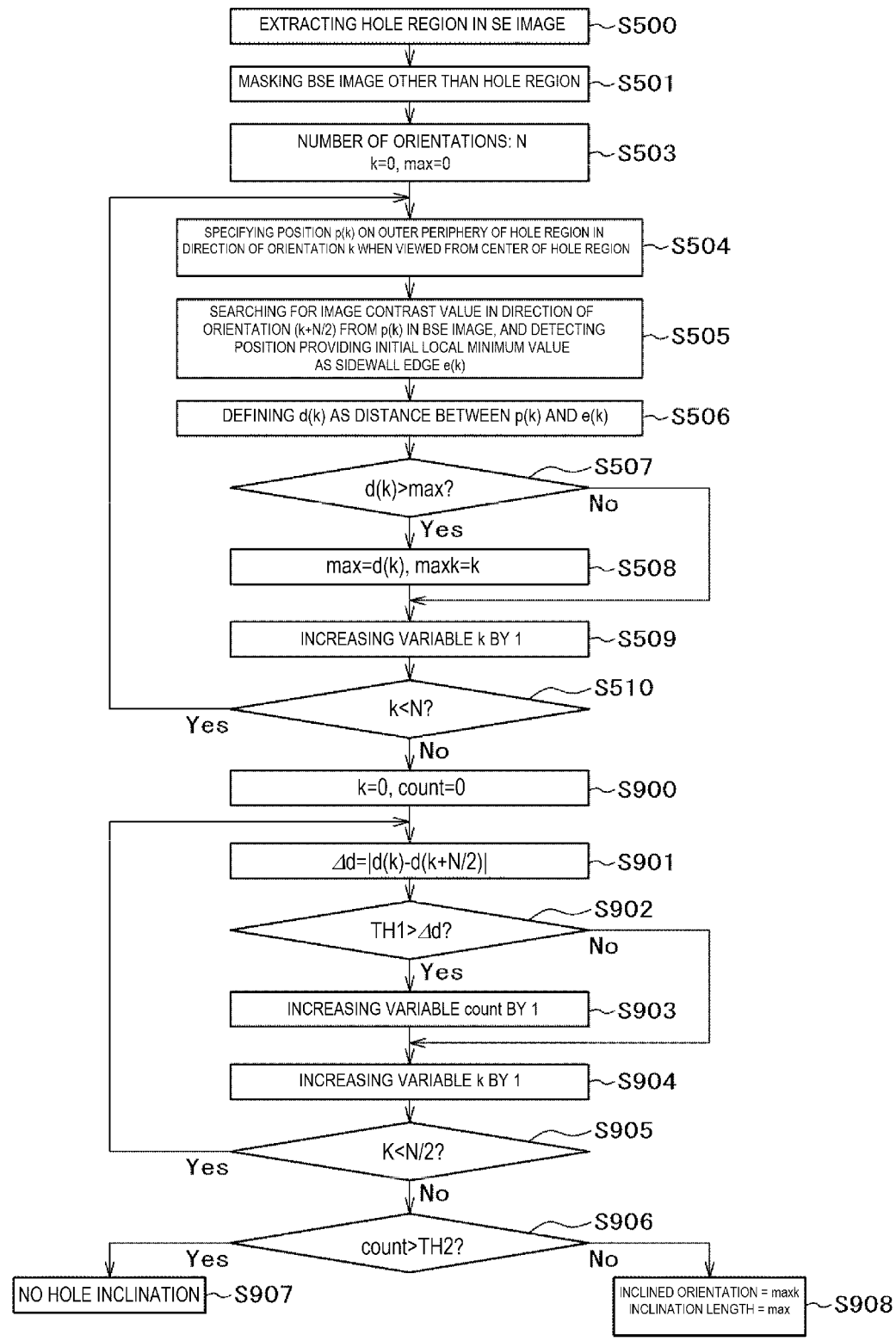
FIG. 9 is a processing flow chart of inclination measurement of a hole determined as not inclined according to the first embodiment of the invention.

FIG. 9 is a flow chart in which non-inclination determination is added to measurement processing of hole inclination. Processing from S500 to S510 in FIG. 9 is the same as that illustrated in FIG. 5, and the distance d(k) from the hole region outer peripheral point p(k) to the sidewall edge e(k) in the orientations 0 to N−1 has been determined when the process proceeds to S900.

In S900, the processing variables k and count are initialized. An absolute value Δd of a difference between the distance d(k) obtained at the orientation k and a distance d(k+N/2) obtained at an orientation (k+N/2) opposite to the orientation k is obtained (S901). Δd is compared with a predetermined threshold values TH1 (S902), and if Δd is smaller, the variable count is increased by 1 (S903). The variable k is increased by 1 (S904), k is compared with N (S905), and if k is smaller than N/2, the process returns to S901 to repeat the process.

If k is N/2 or more, the process proceeds to S906, and count is compared with a predetermined threshold value TH2 (S906). A case where count is larger than the predetermined threshold value TH2 indicates more orientations having a small difference between the opposite distances d(k) and d (k+N/2). For example, if count is equal to N/2, the distance from the hole outer periphery to the side wall end is approximately the same in all orientations, which means that the side wall is not observed due to hole inclination (S907). It is considered that a value of count closer to N/2 indicates smaller hole inclination. In a case where count is no more than the predetermined threshold TH2, the inclined orientation and the inclination length are output (S908) similarly as S511 in FIG. 5.

Figure 10:
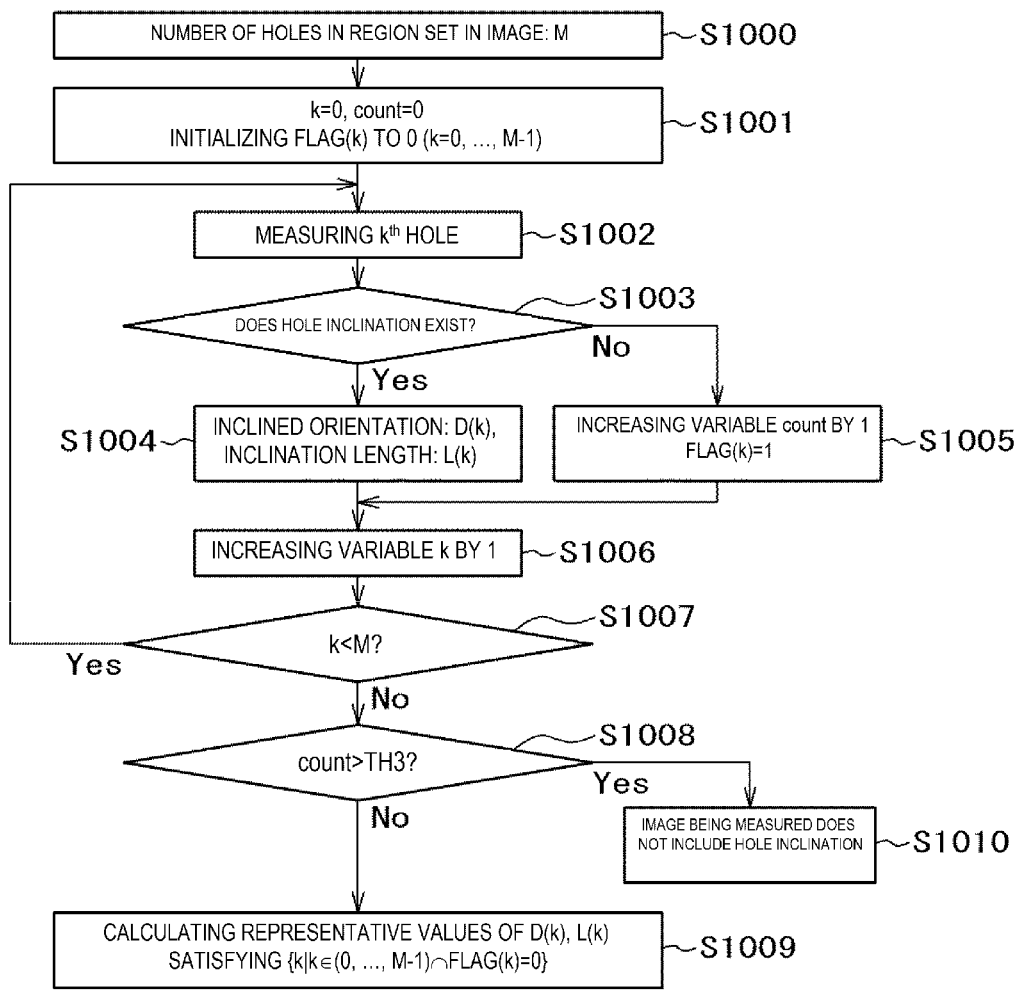
FIG. 10 is a processing flow chart of calculating representative measurement values of an image being measured, in which determination process of no inclination is added to the method of obtaining representative values when a plurality of holes exist in an image according to the first embodiment of the invention.

FIG. 10 is a flow chart in a case where determination process of no inclination is added to the method of obtaining representative values when a plurality of holes exist in an image as illustrated in FIG. 7. First, a number of holes being processed in the image is defined as M (S1000). The variables k, count and a flag array FLAG(k) are initialized to 0 (S1001), and measurement of a $k^{th}$ hole is performed in a procedure as shown in the processing flow in FIG. 9 (S1002). Next, presence or absence of inclination of a hole being measured is determined (S1003). If inclination exists (a case of Yes in S1003), the inclined orientation of the $k^{th}$ hole is set to D(k), and the inclination length thereof is set to L(k) (S1004); and if no inclination exists (a case of No in S1003), the variable count is increased by 1 and FLAG(k) is set to 1. Next, the variable k is increased by 1 (S1006), the variable k is compared with M (S1007), and if the variable k is smaller than M (a case of YES in S1007), the process returns to S1002 to repeat the process.

If the variable k is M or more (a case of No in S1007), count is compared with a predetermined threshold TH3 (S1008), and if count is no more than TH3 (a case of No in S1008), representative values of D(k) and L (k) are calculated from k (k∈(0, . . . , m−1)) whose FLAG(k) is 0 (S1009). The method for calculating the representative values is as described above. If count is larger than TH3 (a case of Yes in S1008), the image being measured is determined as not including hole inclination (S1010).

With reference to FIGS. 11 to 16, a method of detecting the inclined orientation in a case where a plug exists at the bottom of the hole will be described.

Figure 11:
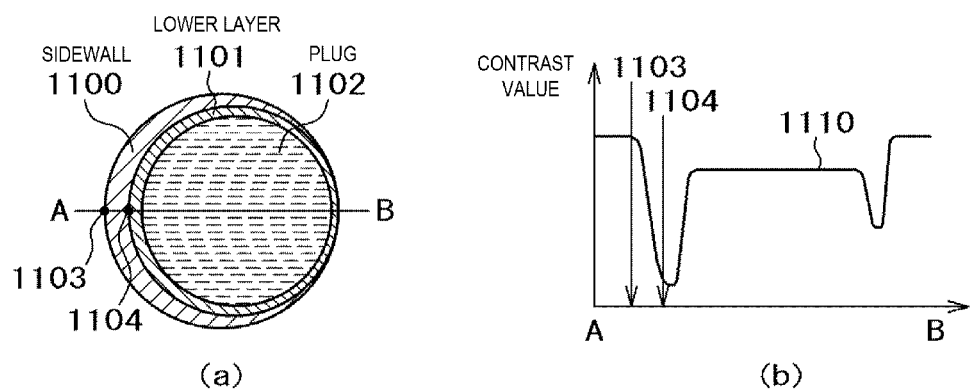
FIG. 11 is a diagram illustrating a method of detecting an inclined orientation when a plug exists at a bottom of a hole according to the first embodiment of the invention, and is an explanatory diagram of a hole having a plug at the bottom of the hole and having a small overlap displacement.

FIG. 11(a) is a schematic view of a top view of a hole having a small hole inclination and a small displacement of the plug, and FIG. 11(b) is a contrast value waveform 1110 representing an image contrast value on a line A-B in FIG. 11(a). A region 1000 hatched with horizontal solid lines in FIG. 11(a) is a sidewall, a region 1001 hatched with right obliquely downward solid diagonal lines is a lower layer, and a region 1002 hatched with horizontal broken lines is a plug. Similarly as FIG. 11, in the hatching of each region in the schematic view of the hole top view images in FIGS. 12 to 16, the horizontal solid lines represent the sidewall, the right obliquely downward solid diagonal lines represent the lower layer, and the horizontal broken lines represent the plug.

The contrast value waveform 1110 in FIG. 11(b) starts to decrease on the hole outer periphery 1103 toward a direction from A to B, and reaches a dark portion of the lower layer 1101 at the sidewall edge 1104. With a contrast value of the hole top outer periphery (hole outer periphery) 1103 as Max, and a local minimum contrast value that appears first in the direction from A to B from the hole outer periphery 1103 as Min, the threshold th can be determined from (Formula 2), so as to determine a position of the sidewall edge 1104 and a position of the vicinity thereof. A better result can be obtained by lowering a sensitivity in a manner capable of searching for a value having a difference no less than a certain value from the contrast value Max, so as not to pick up image noise and the like during detection of the local minimum contrast value.

Figure 12:
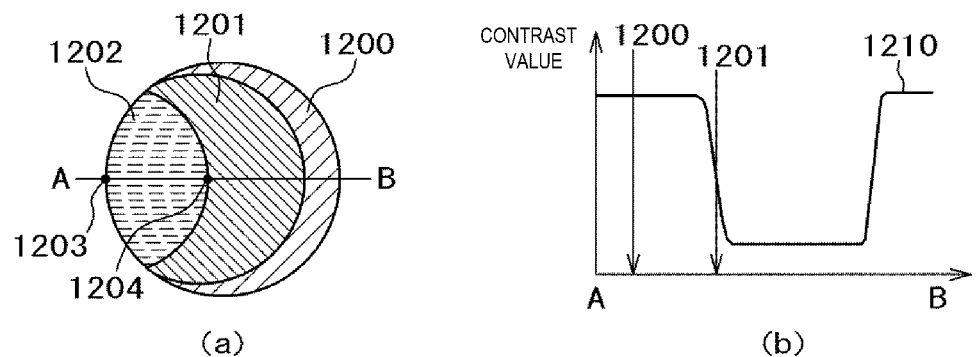
FIG. 12 is a top view image schematic view (a) of a hole having a plug at a bottom of the hole and having an overlap displacement in a direction opposite to inclination of a sidewall, and a graph showing a waveform of an image contrast value on a line A-B.

A schematic view of the hole top view image in FIG. 12(*a*) shows a case where a sidewall 1200 is visible due to hole inclination and the plug 1202 is partially observed with the plug 1202 displaced to an opposite side of the sidewall 1200. A contrast value waveform 1210 in a case where the plug 1202 is bright at the same degree as a surface layer is shown in FIG. 12(*b*). In a direction from a hole outer periphery 1203 to B as well, the contrast value does not decrease in a portion of the plug 1202, and the contrast value decreases in the vicinity of a plug end 1204 which is a boundary between the plug 1202 and a lower layer 1201. Therefore, when the detection method of the sidewall edge 1104 illustrated in FIG. 11 is applied, the plug end 1204 is mis-detected as a sidewall edge.

Figure 13:
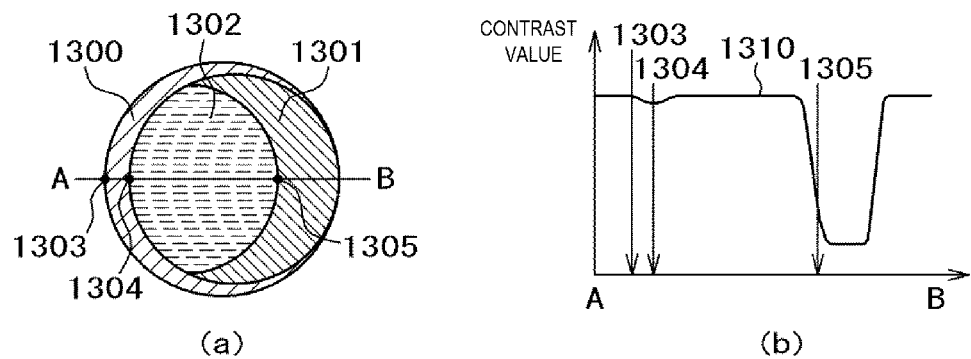
FIG. 13 is a diagram illustrating the method of detecting an inclined orientation when a plug exists at a bottom of a hole according to the first embodiment of the invention, and is a top view image schematic view (a) of a hole having a plug at a bottom of the hole and having an overlap displacement in a direction identical to inclination of a sidewall and a graph showing a waveform of an image contrast value on a line A-B.

A schematic view of the hole top view image in FIG. 13(*a*) shows a case where a sidewall 1300 is visible due to hole inclination and the plug 1302 is displaced to an opposite side of the sidewall 1300 and is observed. In a case where the plug 1302 is bright at the same degree as the surface layer, in a contrast value waveform 1310 as shown in FIG. 13(*b*), a contrast value does not sufficiently decrease from a hole outer periphery 1303 to a sidewall end 1304, and the contrast value decreases in the vicinity of a plug end 1305, which is a boundary between the plug 1302 and a lower layer 1301. Therefore, since a sensitivity is lowered at some degree to search for the local minimum value in the detection method of the sidewall edge 1104 illustrated in FIG. 11, the plug end 1305 may be mis-detected as a sidewall edge when applying the method of FIG. 11.

Figure 14:
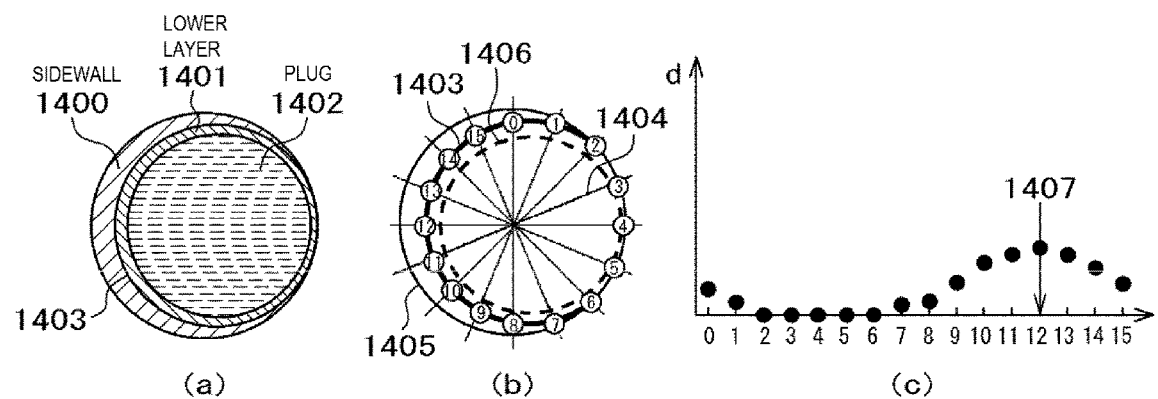
FIG. 14 is a diagram illustrating the method of detecting an inclined orientation when a plug exists at a bottom of a hole according to the first embodiment of the invention, and is a top view image schematic view (a) of a hole having a plug at a bottom of the hole and having a small overlap displacement, a schematic view (b) showing a visual field of an image illustrating detection orientations and sidewall end detection positions detected in each of the detection orientations, and a graph (c) plotting a distance d between a hole outer periphery point and the sidewall detection position in each of the detection orientations.

FIG. 14(*a*) is a schematic view of a top view of a hole in a state similar as the hole illustrated in FIG. 11(*a*), i.e., in a state where a plug 1402 has a small displacement, and an end of the plug 1402 and an outer periphery of a hole are not in contact with each other.

FIG. 14(*b*) shows a result of detecting a sidewall end 1403, which is a boundary between a sidewall 1400 and a lower layer 1401, in 16 orientations at equal angular intervals. Circled numbers indicate orientation numbers, and positions of the circled numbers indicate detection positions of the sidewall end 1403. Radial straight lines 1404 represent 16 orientations at equal angular intervals. A hole outer periphery 1405 is represented by a thin solid circle, the sidewall end 1403 is represented by a thick solid circle, and an outer periphery 1406 of the plug 1402 is represented by a dashed circle.

FIG. 14(*c*) is obtained by plotting a distance d between a point on the hole outer periphery 1405 and the detection position of the sidewall end 1403 in each orientation (the radial straight line 1404), where a vertical axis is the distance d, and the horizontal axis is each orientation corresponding to the circled numbers in FIG. 14(*b*). The distance d is maximum at an orientation 12: 1407. Thereby, the inclined orientation is 12, and the inclination length is d in the orientation 12.

Figure 15:
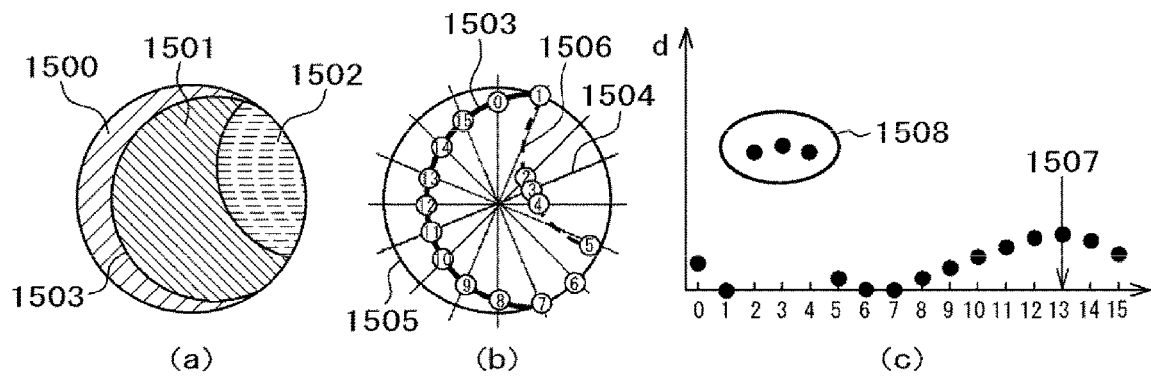
FIG. 15 is a diagram illustrating the method of detecting an inclined orientation when a plug exists at a bottom of a hole according to the first embodiment of the invention, and is a top view image schematic view (a) of a hole having a plug at a bottom of the hole and having an overlap displacement in a direction opposite to sidewall inclination, a schematic view (b) showing a visual field of an image illustrating detection orientations and sidewall end detection positions detected in each of the detection orientations, and a graph (c) plotting a distance d between a hole outer periphery point and the sidewall detection position in each of the detection orientations.

FIG. 15(*a*) is a schematic view of a top view image of a hole showing a state similar as the hole shown in FIG. 12(*a*), i.e., a case where a sidewall 1500 is visible due to hole inclination and the plug 1502 is partially observed with the plug 1502 displaced to an opposite side of the sidewall 1500.

FIG. 15(*b*) shows a result of detecting a sidewall end 1503, which is a boundary between the sidewall 1500 and a lower layer 1501, in 16 orientations at equal angular intervals. Circled numbers indicate orientation numbers, and positions of the circled numbers indicate detection positions of the sidewall end 1503. Radial straight lines 1504 represent 16 orientations at equal angular intervals. A hole outer periphery 1505 is represented by a thin solid circle, the sidewall end 1503 is represented by a thick solid circle, and an outer periphery (a plug end) 1506 of the plug 1502 is represented by a dashed circle. The plug end 1506 is detected at orientations 2, 3, and 4.

FIG. 15(*c*) is obtained by plotting a distance d between a point on the hole outer periphery 1505 and the detection position of the sidewall end 1503 in each orientation (the radial straight line 1504), where a vertical axis is the distance d, and the horizontal axis is each orientation corresponding to the circled numbers in FIG. 15(*b*). The distance d in the orientations 2, 3, 4 surrounded by an ellipse 1508 indicates a pattern different from the other orientations in which the sidewall end 1503 is detected. Examples of a method of detecting the portion surrounded by the ellipse 1508 include: measuring a distance d in orientations adjacent to each other, and detecting a section having a d no less than a predetermined threshold value at both ends thereof, and having a d in an orientation adjacent to the section on the outside smaller than the d in the orientation at both ends. An orientation providing a maximum distance d in each orientation excluding the detected section is detected. In FIG. 15(*c*), the distance d is maximum at an orientation 13: 1507. Thereby, the inclined orientation is 13, and the inclination length is d in the orientation 13.

Figure 16:
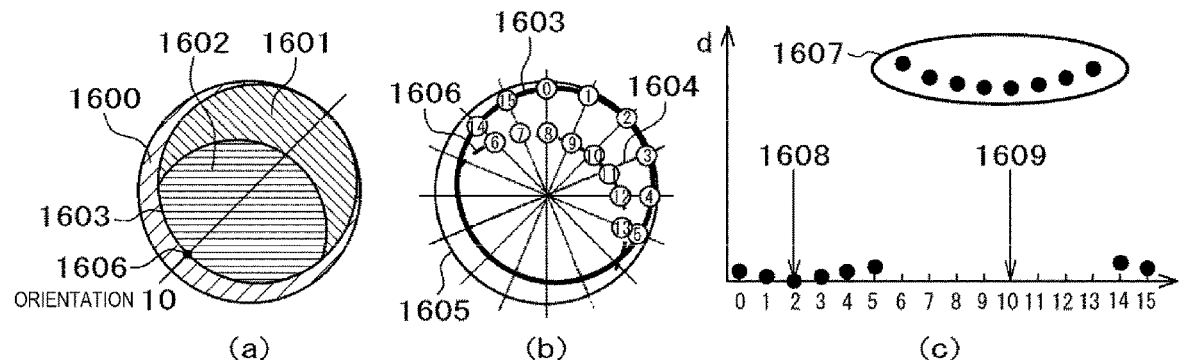
FIG. 16 is a diagram illustrating the method of detecting an inclined orientation when a plug exists at a bottom of a hole according to the first embodiment of the invention, and is a top view image schematic view (a) of a hole having a plug at a bottom of the hole and having an overlap displacement in a direction identical to sidewall inclination, a schematic view (b) showing a visual field of an image illustrating detection orientations and sidewall end detection positions detected in each of the detection orientations, and a graph (c) plotting a distance d between a hole outer periphery point and the sidewall detection position in each of the detection orientations.

FIG. 16(*a*) is a schematic view of a top view image of a hole showing a state similar as the hole shown in FIG. 13(*a*), i.e., a case where a sidewall 1600 is visible due to hole inclination, and the plug 1602 is displaced to the same side as the sidewall 1600 and is partially observed.

FIG. 16(*b*) shows a result of detecting a sidewall end 1603, which is a boundary between the sidewall 1600 and a lower layer 1601, in 16 orientations at equal angular intervals. Circled numbers indicate orientation numbers, and positions of the circled numbers indicate detection positions of the sidewall end 1603. Radial straight lines 1604 represent 16 orientations at equal angular intervals. A hole outer periphery 1605 is represented by a thin solid circle, the sidewall end 1603 is represented by a thick solid circle, and an outer periphery (a plug end) 1606 of the plug 1602 is represented by a dashed circle. The plug end 1606 is detected at orientations 6 to 13.

FIG. 16(*c*) is obtained by plotting a distance d between a point on the hole outer periphery 1605 and the detection position of the sidewall end 1603 in each orientation (the radial straight line 1604), where a vertical axis is the distance d, and the horizontal axis is each orientation corresponding to the circled numbers in FIG. 16(*b*). As shown in the region surrounded by an ellipse 1607, the distance d in the orientations 6 to 13 indicates a pattern different from the other orientations in which the sidewall end 1603 is detected. The portion indicated by the ellipse 1607 may be detected by a method similar to the method illustrated in FIG. 15.

In the case shown in FIG. 16(*b*), since the portion where a distance between the hole outer periphery 1605 and the actual sidewall end 1603 cannot be detected due to the plug 1602, an orientation 1608 (the orientation 2) providing a minimum distance d in each orientation excluding a portion of the sidewall end 1603 is detected. An orientation providing an actual maximum distance d is 180-degree opposite to the orientation providing the minimum distance d, and thereby an inclined orientation 1609 (the orientation 10) is determined. The sidewall end 1603 detects the local minimum value of the contrast value in a direction from the point on the hole outer periphery 1605 to the hole center in the orientation 10 by increasing the sensitivity (to a sensibility capable of detecting the position having the local minimum value in FIG. 13(*b*): the sidewall end 1304).

Figure 17:
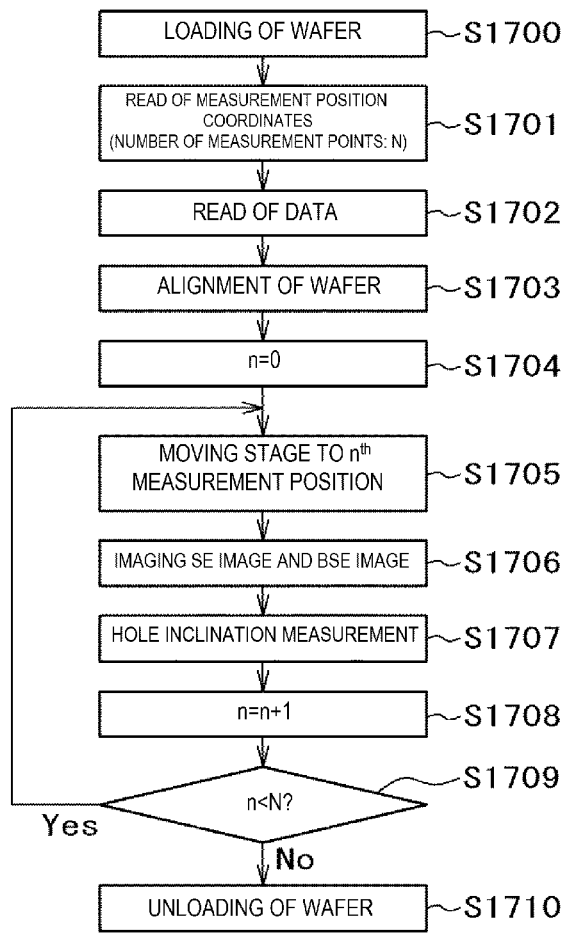
FIG. 17 is an operation flow chart showing measurement using the electron beam microscope device according to the first embodiment of the invention.

FIG. 17 shows an overall flow chart upon measurement. First, a wafer being observed is loaded into the stage 108 of the electron microscope device 100 shown in FIG. 1 (S1700). Next, measurement position coordinate data including a number of measurement points N is read via an external input/output I/F (not shown) of the control unit 120 (S1701). Similarly, the above-described threshold values and parameters necessary for processing are read (S1702). Next, wafer alignment is performed (S1703). That is, the coordinates on the wafer are correlated with stage coordinates by using a known positioning mark on the wafer, so that a measurement point as a target comes to a center of a visual field when the stage 108 is moved on the basis of the positions of the measurement position coordinates described by coordinates on the wafer.

Thereafter, a series of procedures shown in steps S1705 to S1708 are sequentially repeated with respect to all the measurement points or the measurement points that are not shown but are selected, so as to perform hole inclination measurement. First, the stage is moved to an $n^{th}$ measurement point position (S1705). Although not shown in the drawings, the measurement point may be put in the visual field via beam movement even after moving the stage to the vicinity of the measurement point and performing specific coordinate correction. Next, the SE image and the BSE image are imaged at the measurement point (S1706). Device control accompanying imaging of the SE image and the BSE image is as illustrated in FIG. 1.

Next, hole inclination measurement processing is performed (S1707). A content of the processing in S1707 is the content described with reference to FIGS. 4 to 16, and the processing is executed by the calculation unit 119 in FIG. 1. The representative values of the inclined orientation and the inclination length of the hole calculated in S1707 (refer to S705 in FIG. 7 or S1009 in FIG. 10) is stored in the storage unit 118 of FIG. 1, and are output to the outside via the input/output I/F (not shown) by the control unit 120.

Stage movement to the next measurement point may be performed without waiting for end of the hole inclination measurement processing (S1707). If the measurement processing is ended within a time of stage movement to the next measurement point, measurement processing is performed during movement. If measurement processing cannot be ended within the time of stage movement to the next measurement point, imaging and measurement processing may be desynchronized so as to store the images in the storage unit 118 and to sequentially process the imaged images, or the imaged images may be stored in another storage unit and separately subjected to offline batch processing. If a next measurement point exists, the stage is moved to the next measurement point, and steps S1705 to S1708 are repeated. When acquisition of all the measurement images is ended, the wafer is unloaded from the stage 108, and the processing is ended.

In a hole process having the plug 202 shown in FIG. 2, it is important that the opening (the hole outer periphery) on the upper layer and the plug 202 of the hole region 200 overlap correctly, and overlap measurement (overlay measurement) may be performed. However, if inclination of the hole is large, it is difficult to measure correct overlap.

Figure 18:
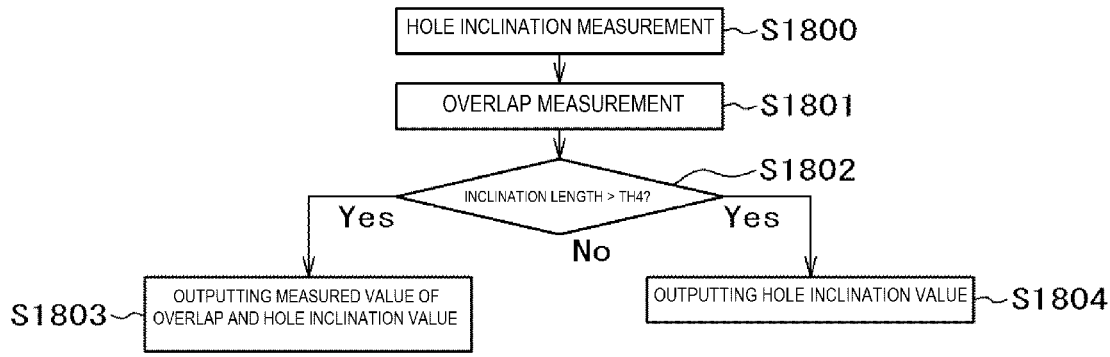
FIG. 18 is an operation flow chart showing operation flow of measurement using the electron beam microscope device according to the first embodiment of the invention, in which overlap measurement is performed in addition to hole inclination measurement.

FIG. 18 shows a processing flow for controlling whether or not overlap measurement is possible in accordance with the degree of hole inclination. First, hole inclination measurement processing is performed (S1800). A content of the processing in S1800 is the content described with reference to FIGS. 4 to 16. Subsequently, overlap measurement is performed (S1801), the inclination length obtained in the hole inclination measurement processing is compared with the preset threshold value TH4 (S1802). If the inclination length is no less than TH4 (a case of No in S1802), a measured value of overlap and a hole inclination value are output (S1803), and if the inclination length is larger than TH4 (a case of Yes in S1802), only the hole inclination value is output (S1804).

In the overall processing flow of device operation in FIG. 17, if the hole inclination measurement S1707 is replaced with S1800 to S1804, it is possible to execute determination whether or not overlap measurement can be performed in accordance with the degree of hole inclination. Even if the plug at the hole bottom is blocked at some degree by the sidewall or the surface layer in the top view image, for example, it is possible to perform measurement by a method of performing image comparison between a reference image and a measurement image with respect to each layer as described in PTL 3.

Instead of the overlap measurement in S1801, the hole depth measurement and the hole bottom dimension measurement as described in PTL 2 may be performed. Alternatively, at least one of overlap measurement, hole depth measurement, and hole bottom dimension measurement may be performed. In S1803, output is performed in accordance with the measurement item.

Figure 19:
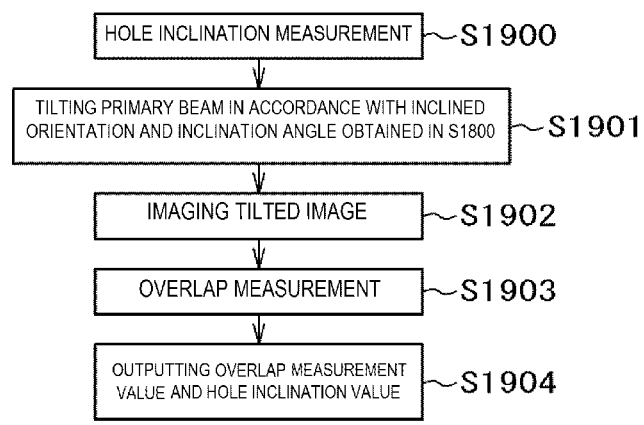
FIG. 19 is a processing flow chart showing operation flow of measurement using the electron beam microscope device according to the first embodiment of the invention, in which beam tilt is performed and hole overlap measurement is performed on the basis of hole inclination measurement.

FIG. 19 shows a processing flow for performing imaging by tilting the beam in accordance with the degree of hole inclination. First, hole inclination measurement processing is performed (S1900). The processing content of S1900 is the content described with reference to FIGS. 4 to 16.

Next, the inclination length obtained in the hole inclination measurement processing in S1900 is converted to the inclination angle of the hole, so as to tilt a primary beam (S1901). Tilt of the primary beam is performed by inputting the converted inclination angle to the control unit 120 in FIG. 1, and controlling the polarization lens 104 and the object lens 105 with the control unit 120.

Next, an image is imaged in a beam-tilted state (S1902). The imaged image is in a state where the center of the upper layer opening of the hole and the center of the bottom of the hole are aligned with each other, and thus is also an image suitable for observation of the hole bottom. The processing may be ended with this image stored as an observation image in the storage unit 118. When the overlap measurement is performed, the process proceeds to the following S1903. Finally, the measurement value of overlap and the hole inclination value are output (S1904).

In the overall processing flow of device operation in FIG. 17, if the hole inclination measurement S1707 is replaced with S1900 to S1904, it is possible to execute overlap measurement on the basis of the tilt image in accordance with the degree of hole inclination with respect to all the measurement points. Instead of the overlap measurement in S1903, the hole depth measurement and the hole bottom dimension measurement as described in PTL 2 may be performed. Alternatively, at least one of overlap measurement, hole depth measurement, and hole bottom dimension measurement may be performed. In S1904, output is performed in accordance with the measurement item.

Figure 20:
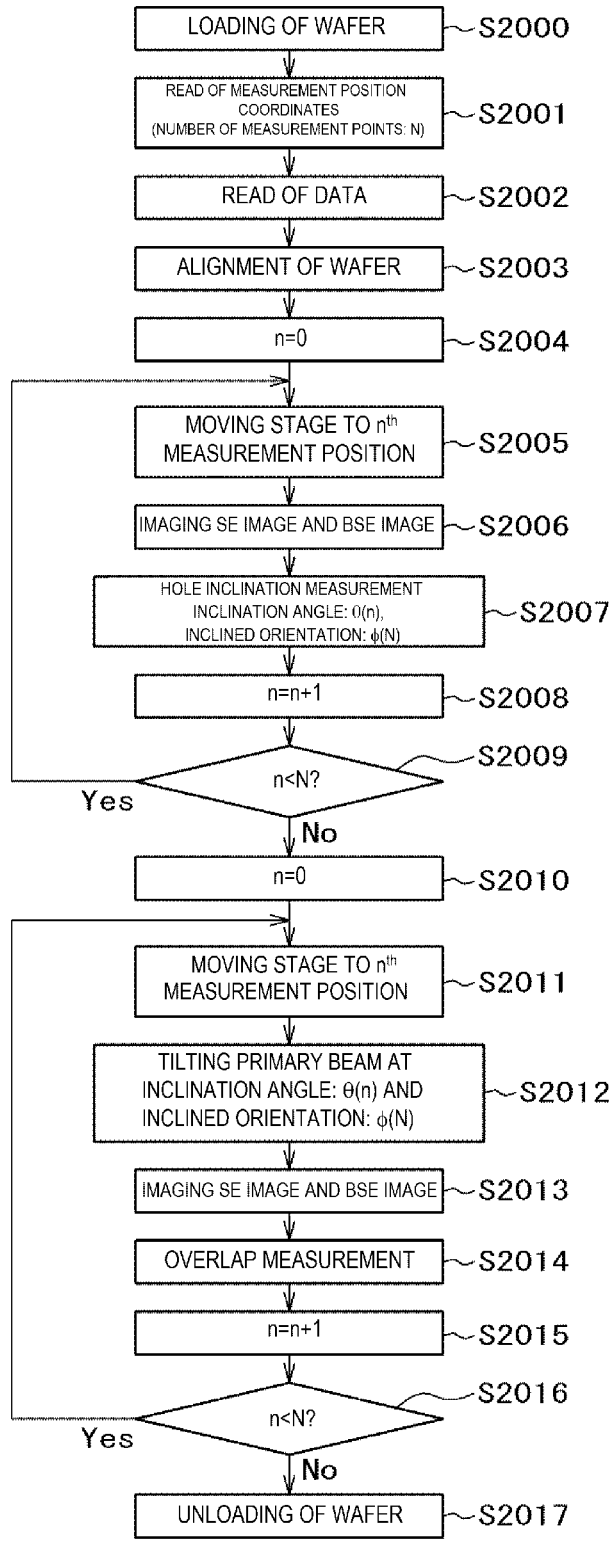
FIG. 20 is a device operation flow chart showing operation flow of measurement using the electron beam microscope device according to the first embodiment of the invention, in which hole inclination measurement is performed, and then hole overlap measurement is performed through beam tilt.

FIG. 20 shows a flow of measuring inclination of all the holes being measured, and then tilting the beam and performing overlap measurement. First, a wafer being observed is loaded into the stage 108 of the electron microscope device 100 shown in FIG. 1 (S2000). Next, measurement position coordinate data including a number of measurement points N is read from an external storage means (not shown) via an external input/output I/F (not shown) of the control unit 120 (S2001). Similarly, the above-described threshold values and parameters necessary for processing are read (S2002). Next, wafer alignment is performed (S2003).

Thereafter, a series of procedures shown in steps S2005 to S2008 are sequentially repeated with respect to all the measurement points or the measurement points that are not shown but are selected, so as to perform hole inclination measurement. First, the stage is moved to an $n^{th}$ measurement point position (S2005). Next, the SE image and the BSE image are imaged at the measurement point (S2006), and hole inclination measurement processing is performed by the calculation unit 119 (S2007). If a next measurement point exists, the stage is moved to the next measurement point, and steps S2005 to S2008 are repeated. Next, an image is imaged by tilting the beam using an inclination angle θ(n) and an inclined orientation φ(n) of the hole obtained in the hole inclination measurement, and combined measurement is performed.

Thereafter, a series of procedures shown in steps S2011 to S2016 are sequentially repeated with respect to all the measurement points or the measurement points that are not shown but are selected in S2004 to S2009, so as to perform hole overlap measurement. First, the stage is moved to an $n^{th}$ measurement point position (S2011). Next, the primary beam is tilted on the basis of the inclination angle θ(n) and the inclined orientation φ(n) (S2012), the SE image and the BSE image are imaged at the measurement point (S2013), and hole overlap measurement is performed by the calculation unit 119 (S2014). If a next measurement point exists, the stage is moved to the next measurement point, and steps S2011 to S2016 are repeated. When acquisition of all the measurement images is ended, the wafer is unloaded from the stage 108, and the processing is ended (S2017). Instead of the overlap measurement in S2014, the hole depth measurement and the hole bottom dimension measurement as described in PTL 1 may be performed. Alternatively, at least one of overlap measurement, hole depth measurement, and hole bottom dimension measurement may be performed.

In FIG. 20, although the primary beam is tilted on the basis of the inclination angle θ(n) and the inclined orientation φ(n) with respect to each measurement point in S2012, the present embodiment is not limited thereto, and the tilt image may be imaged with a beam in the same tilt state with respect to all the measurement points using an average value, a median, or a most frequent value of all the obtained inclination angles θ (n) and inclined orientations φ(n). In this way, it is possible to perform tilt control of the primary beam at one time, and to shorten a measurement time.

Although the above description is made using two images, i.e., the SE image and the BSE image, either one of the images may be selected and processed as long as it is possible to image an image having both an excellent contrast between the upper layer pattern and the hole and an excellent contrast of the hole bottom with either one of the images.

If the BSE image is selected, it is not always necessary to acquire the SE image, and all parts in FIGS. 5 to 20 in which the SE image is processed may be replaced with the BSE image. The SE detection unit 115 and the SE image generation unit 116 in FIG. 1 are not necessary for the use of constituting the functions disclosed in the present application. Japanese Unexamined Patent Application Publication No. 2015-106530 discloses that a BSE image is preferably used in the hole depth measurement and the hole bottom dimension measurement.

Alternatively, if the SE image is selected, it is not always necessary to acquire the BSE image, and all parts in FIGS. 5 to 20 in which the BSE image is processed may be replaced with the SE image.

Alternatively, the SE image and the BSE image may be imaged, and parts in FIGS. 5 to 20, in which both the SE image and the BSE image are processed, may be processed with processing targets replaced with a mixed image, as long as it is possible to generate an image having both an excellent contrast between the upper layer pattern and the hole and an excellent contrast of the hole bottom with an image obtained by synthesizing the SE image and the BSE image.

Figure 21:
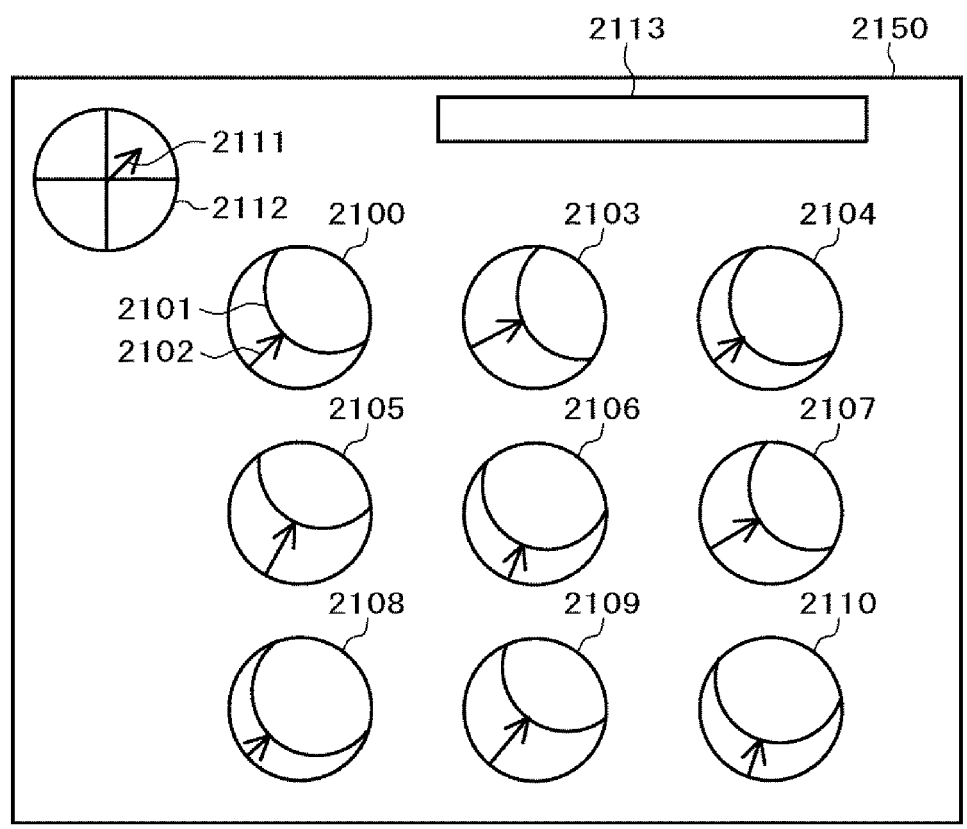
FIG. 21 is a front view of a screen showing an image display example of a measurement result of hole inclination using the electron beam microscope device according to the first embodiment of the invention.

FIG. 21 shows an example of a screen 2150 for displaying an image of a measurement result of hole inclination. The nine holes 2100 and 2103 to 2110 are measurement targets. 2101 schematically represents the sidewall end (the sidewall edge). The measurement result is expressed as a vector from the outer periphery of the hole 2100 to the sidewall edge 2101, which indicates the direction of hole inclination as indicated by 2102. 2102 is not necessarily represented by a vector, and may be, for example, a line segment connecting the outer periphery of the hole 2100 and the sidewall edge 2101. Alternatively, the vector of 2102 may be drawn with a start point thereof moved to an arbitrary position in a range in which correspondence between the hole 2100 and the vector 2102 is known. In actual measurement, the degrees of inclination of each hole are often different from each other.

2112 in FIG. 21 represents a drawing region of a representative value of the measurement result, and a vector 2111 represents a representative value of the measurement result of nine holes. The representative values of the inclined orientation and the inclination length may be displayed as a numerical value in a display area 2113. When determined as no inclination, for example, the numerical value display may be "–". The representative drawing region 2112 is not necessarily located at a location different from the measured holes, and may be displayed in a manner superimposed on any one of the measured holes 2100 and 2013 to 2110 although visibility of the measurement result is hindered.

Figure 22:
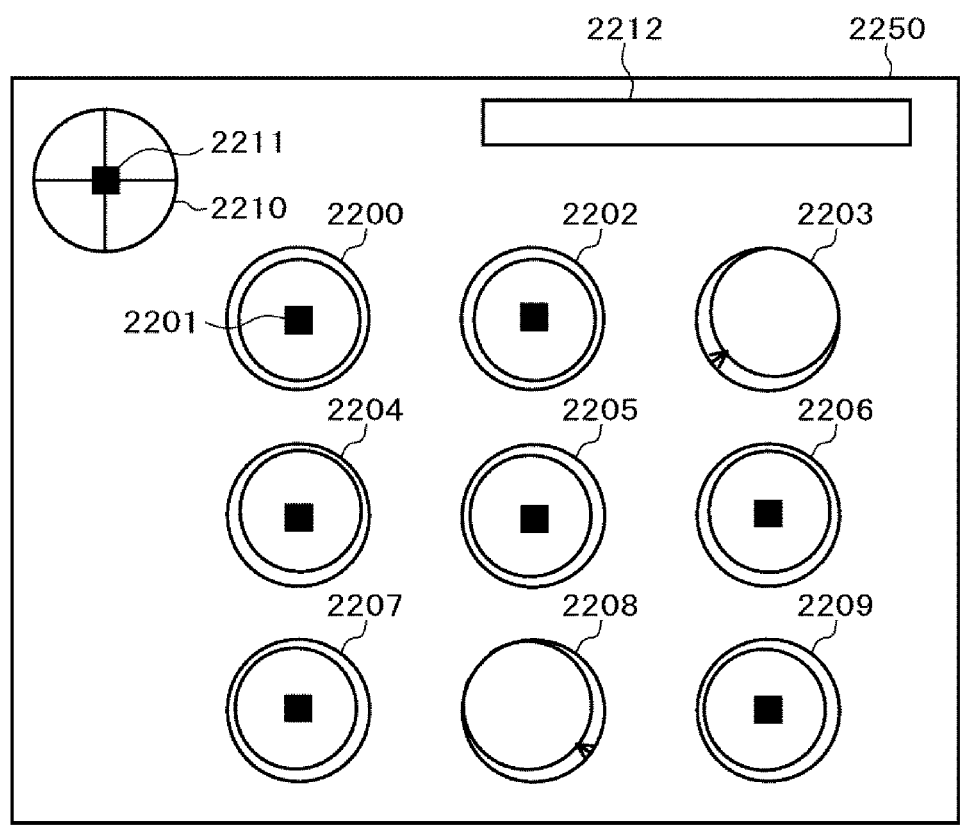
FIG. 22 is a front view of a screen showing an image display example of a measurement result of hole inclination, which includes more normal holes, using the electron beam microscope device according to the first embodiment of the invention.

FIG. 22 shows an example of a screen 2250 for displaying an image of a measurement result, which includes more normal holes. The nine holes 2200 and 2202 to 2209 are measurement targets. A black square mark of 2201 represents a result of the determination that the hole 2200 is not inclined. In the example of FIG. 22, seven holes are determined as not inclined among the nine holes. A ratio of non-inclined holes to a number of holes being measured in one image is preset as a threshold value, and in a case where the ratio of the non-inclined holes in the image exceeds the threshold value, a representative value of the measurement result is also set as no inclination. A black square mark 2211 of a representative drawing region 2210 indicates that the representative value of the measurement result is no inclination. 2112 is a display area for displaying the numerical values of the representative values of the inclined orientation and the inclination length. When determined as no inclination, for example, the numerical value display may be "–".

Figure 23:
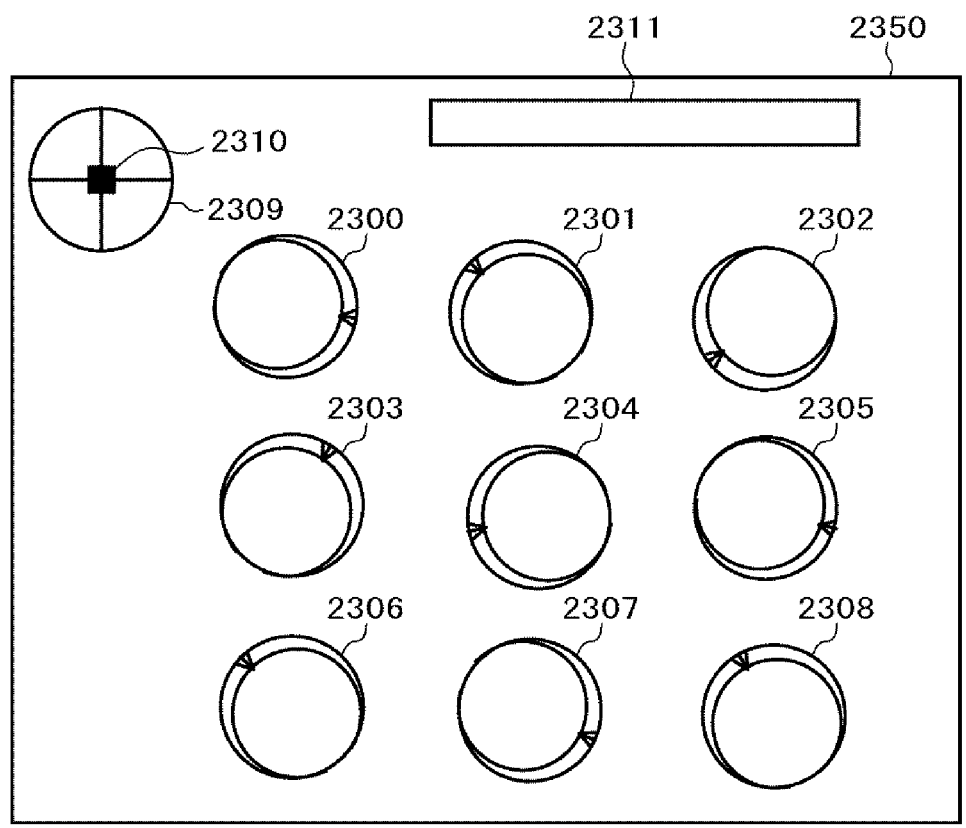
FIG. 23 is a front view of a screen showing an image display example of a measurement result of hole inclination, which includes more normal holes while small inclination amounts are measured in all of the holes, using the electron beam microscope device according to the first embodiment of the invention.

FIG. 23 shows an example of a screen 2350 for displaying an image of a measurement result, which includes more normal holes. The nine holes 2300 to 2208 are measurement targets. This example is an example in which a small inclination amount is measured in all the holes. Since almost no inclination exists, a slight displacement between the hole top and the hole bottom greatly causes a great unevenness of the measured inclined orientation. In order to determine this state, the unevenness of an inclined orientation angle is calculated, and a threshold value TH5 with respect to the unevenness is provided previously. When the unevenness in the inclined orientation angle is no less than the set threshold, the representative value of the measurement result is also set as no inclination. A black square mark 2310 of a representative drawing region 2309 indicates that the representative value of the measurement result is no inclination. The display area 2311 is an area for displaying numerical values of representative values of the inclined orientation and the inclination length, but may also display the unevenness of the inclined orientation. Further, the threshold value TH5 with respect to the unevenness may be displayed together.

According to the present embodiment, it is possible to measure a degree of inclination of a hole having a high aspect ratio from a top view image of the hole even when a bottom portion of the hole is blocked by a surface layer due to hole inclination. Moreover, in a case where overlap measurement, depth measurement, and/or hole bottom dimension measurement are performed together with hole inclination measurement, when the degree of hole inclination is large, output of the measurement result of overlap measurement, depth measurement, and hole bottom dimension measurement is stopped, and output of a result of erroneous measurement can be prevented.

The present invention is described in the above, while the disclosure of the present specification also includes: an electron microscope device starting from a measurement image and provided with: a means for calculating for individual holes, from an image obtained by measuring a measurement target, indexes pertaining to an inclined orientation and an inclination angle, on the basis of the distance between the outer periphery of the hole region and the hole bottom that has been detected in the direction of the hole center from the outer periphery; and a means for calculating, from the results measured for the individual holes included in an image being measured, indexes pertaining to an inclined orientation of the hole and an inclination angle of the hole as representative values for the image being measured, and includes a hole measurement method.

REFERENCE SIGN LIST

100 Electron microscope device
101 Electron gun
102 Primary electron beam
103 Condenser lens
104 Polarizing lens
105 Object lens
106 Annular scintillator
107 ExB deflector
108 Stage
109 Input/output unit
110 Backscattered electrons
111 Optical fiber
112 Photomultiplier tube
113 Image generation unit
114 Secondary electrons
115 Photomultiplier tube
116 Image generation unit
117 Sample
118 Storage unit
119 Calculation unit
120 Control unit
200 Hole region
201 Upper layer
202 Plug
203 Lower layer
204 Sidewall
300 Hole region
301 Upper layer
302 Lower layer
303 Sidewall
400 Hole top outer periphery
401 Sidewall
402 Lower layer
403 Sidewall edge
404 Inclination length
405 Inclined orientation
1100 Sidewall
1101 Lower layer
1102 Plug
1103 Hole top outer periphery
1104 Sidewall edge
1200 Sidewall
1201 Lower layer
1300 Sidewall
1301 Lower layer
1302 Plug
1400 Sidewall
1401 Lower layer
1402 Plug
1500 Sidewall
1501 Lower layer
1502 Plug
1600 Sidewall
1601 Lower layer
1602 Plug

The invention claimed is:

1. An electron microscope device for measuring inclination of a hole formed on a semiconductor wafer, the electron microscope device comprising:
a first detection unit disposed at a high elevation angle and configured to detect electrons having relatively low energy among electrons generated from the semiconductor wafer on which the hole is formed due to a primary electron beam irradiated on the semiconductor wafer;
a second detection unit disposed at a low elevation angle and configured to detect electrons having relatively high energy among the electrons generated from the semiconductor wafer due to the primary electron beam irradiated on the semiconductor wafer;
a hole region specification unit configured to process a first image obtained from an output signal from the first detection unit in which the electrons having relatively low energy are detected, so as to specify a hole region of a semiconductor pattern in a preset region;
an inclination information calculation unit configured to process a second image obtained from an output signal from the second detection unit in which electrons having relatively high energy are detected, so as to calculate for the individual hole regions, indexes pertaining to an inclined orientation of the hole region and an inclination angle of the hole region with respect to the plurality of hole regions included in the second image, on the basis of a distance between an outer periphery of the hole region specified by the hole region specification unit and a hole bottom of the hole region detected in a center direction of the hole region from the outer periphery; and an index value calculation unit configured to calculate, from a result calculated for the individual hole regions by the inclination information calculation unit, index values pertaining to the inclined orientation of the hole region and the inclination angle of the hole region as representative values of the plurality of hole regions in the second image.

2. The electron microscope device according to claim 1, wherein
one or all of overlap measurement, hole bottom dimension measurement, and hole depth measurement are selected and processed on the basis of the index values calculated by the index value calculation unit.

3. The electron microscope device according to claim 1, wherein
the primary electron beam is tilted on the basis of the index values calculated by the index value calculation unit and is irradiated on the semiconductor wafer, and electrons generated from the semiconductor wafer are detected by the first detection unit and the second detection unit.

4. The electron microscope device according to claim 3, wherein
a signal detected by the first detection unit and the second detection unit is processed, so as to perform at least one of overlap measurement, hole bottom dimension measurement, and hole depth measurement.

5. The electron microscope device according to claim 1, further comprising a display unit, the display unit being configured to display, with line segment, on the second image, the index values pertaining to the inclined orientation and the inclination angle of the individual hole regions calculated in the region preset with respect to the second image by the inclination information calculation unit, and the display unit being configured to display, with line segment, on the second image, the index values pertaining to the inclined orientation and the inclination angle as representative values of the second image from the index values pertaining to the inclined orientation and the inclination angle of the individual hole regions calculated by the index value calculation unit.

6. The electron microscope device according to claim 5, wherein
the inclination information calculation unit determines presence or absence of inclination of the hole region on the basis of distance information from the outer periphery of the hole region to a sidewall end of the hole region detected in a center direction of the hole region, and the hole regions determined as no inclination whose hole region is not inclined are not displayed with line segment on the display unit.

7. The electron microscope device according to claim 6, wherein
when a number of the hole regions determined as no inclination whose hole region is not inclined exceeds a specific preset ratio to a number of the hole regions being measured in the second image, or when an unevenness in the inclined orientation measured in the hole region is no less than a predetermined value, line segment display is not performed on the display unit, and a measured value of inclination of the second image is displayed as no inclination.

8. A method for measuring inclination of a hole formed on a semiconductor wafer with an electron microscope device, the method comprising:
a process detecting electrons having relatively low energy among electrons generated from the semiconductor wafer on which the hole is formed due to a primary electron beam irradiated on the semiconductor wafer with a first detection unit disposed at a high elevation angle, and generating a first image;
a process detecting electrons having relatively high energy among the electrons generated from the semiconductor wafer due to the primary electron beam irradiated on the semiconductor wafer with a second detection unit disposed at a low elevation angle, and generating a second image;
a hole region specification process processing a first image generated in the process generating the first image, so as to specify a hole region of a semiconductor pattern in a preset region;
an inclination information calculation process processing the second image generated in the process generating the second image, so as to calculate for the individual hole regions, indexes pertaining to an inclined orientation and an inclination angle, on the basis of a distance between an outer periphery of the hole region and a hole bottom detected in a center direction of the hole region from the outer periphery; and
a process calculating, from a result measured for the individual hole regions included in the second image processed in the inclination information calculation process, index values pertaining to the inclined orientation of the hole region and the inclination angle of the hole region as representative values of the plurality of hole regions included in the second image; and an index value calculation process.

9. The inclined hole measurement method using an electron microscope device according to claim 8, further comprising: selecting and processing one or all of overlap measurement, hole bottom dimension measurement, and hole depth measurement, on the basis of the index values calculated in the inclination information calculation process.

10. The inclined hole measurement method using an electron microscope device according to claim 8, wherein
the primary electron beam is tilted on the basis of the index values calculated in the inclination information calculation process and is irradiated on the semiconductor wafer, and electrons generated from the semiconductor wafer are detected by the first detection unit and the second detection unit.

11. The inclined hole measurement method using an electron microscope device according to claim 10, wherein
at least one of overlap measurement, hole bottom dimension measurement, and hole depth measurement is performed, on the basis of the index values calculated in the inclination information calculation process.

12. The inclined hole measurement method using an electron microscope device according to claim 8, comprising:
a process displaying, with line segment, on the second image on a screen, the index values pertaining to the inclined orientation and the inclination angle of the individual hole regions calculated in the region preset with respect to the second image in the inclination information calculation process; and a process displaying, with line segment, on the screen, the index values pertaining to the inclined orientation and the inclination angle as representative values of the second image from the index values pertaining to the inclined orientation and the inclination angle of the individual hole regions calculated in the region preset with respect to the second image in the inclination information calculation process.

13. The inclined hole measurement method using an electron microscope device according to claim 12, comprising: a process in the inclination information calculation process determining presence or absence of inclination of the hole region on the basis of distance information from the outer periphery of the hole region to a sidewall end of the hole region detected in a center direction of the hole region, wherein in the process determining presence or absence of inclination of the hole region, the hole regions determined as no inclination whose hole region is not inclined are not displayed with line segment on the screen.

14. The inclined hole measurement method using an electron microscope device according to claim 13, wherein when a number of the hole regions determined as no inclination whose hole region is not inclined exceeds a specific preset ratio to a number of the hole regions being measured in the second image, or when an unevenness in the inclined orientation measured in the hole region is no less than a predetermined value, line segment display is not performed on the screen, and a measured value of inclination of the second image is displayed as no inclination on the screen.

15. An electron microscope device for measuring inclination of a hole formed on a semiconductor wafer, the electron microscope device comprising:

a means for calculating for individual holes, from an image obtained by irradiating a semiconductor wafer on which a plurality of holes are formed with a primary electron beam and detecting electrons generated from the semiconductor wafer, indexes pertaining to an inclined orientation and an inclination angle, on the basis of a distance between an outer periphery of the hole formed on the semiconductor wafer and a hole bottom detected in a center direction of the hole from the outer periphery; and a means for calculating, from a result measured for the individual holes included in the image, indexes pertaining to an inclined orientation of the hole and an inclination angle of the hole as representative values of the plurality of holes included in the image.

16. The electron microscope device according to claim 15, wherein: the indexes pertaining to the inclined orientation and the inclination angle of the individual holes calculated in a region preset with respect to the image are displayed with line segment on the image;

index values pertaining to the inclined orientation and the inclination angle as representative values of the plurality of holes included in the image obtained from the indexes pertaining to the inclined orientation and the inclination angle of the individual holes are displayed with line segment; and the index values pertaining to the inclined orientation and the inclination angle as representative values are used as measurement output of the image.

17. The electron microscope device according to claim 16, wherein presence or absence of hole inclination is determined on the basis of a distance from the outer periphery of the hole region to a sidewall end of the hole detected in the center direction of the hole, and the holes determined as no inclination are not displayed with a line segment in the image.

18. The electron microscope device according to claim 17, wherein when a number of the holes determined as no inclination exceeds a specific ratio to a number of the holes being measured in the image, or when an unevenness in the inclined orientation measured for the individual holes is no less than a predetermined value, line segment display is not performed, and a measured value of inclination of the image is displayed as the no inclination.

* * * * *